US010707909B2

(12) United States Patent
 Watanabe

(10) Patent No.: US 10,707,909 B2
(45) Date of Patent: Jul. 7, 2020

(54) RADIO FREQUENCY CIRCUIT, RADIO-FREQUENCY FRONT-END CIRCUIT, AND COMMUNICATION DEVICE

(71) Applicant: Murata Manufacturing Co., Ltd., Kyoto (JP)

(72) Inventor: Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 114 days.

(21) Appl. No.: 16/126,542

(22) Filed: Sep. 10, 2018

(65) Prior Publication Data

US 2019/0081651 A1   Mar. 14, 2019

(30) Foreign Application Priority Data

Sep. 12, 2017  (JP) ................................. 2017-174814

(51) Int. Cl.
| | |
|---|---|
| *H01Q 1/24* | (2006.01) |
| *H04B 1/18* | (2006.01) |
| *H01Q 5/328* | (2015.01) |
| *H03F 3/189* | (2006.01) |
| *H01Q 15/00* | (2006.01) |

(Continued)

(52) U.S. Cl.
CPC ............... *H04B 1/18* (2013.01); *H01Q 5/328* (2015.01); *H01Q 15/0066* (2013.01); *H03F 3/189* (2013.01); *H03F 3/195* (2013.01); *H03F 3/245* (2013.01); *H04B 1/0458* (2013.01); *H04B 1/48* (2013.01); *H01Q 1/50* (2013.01);

(Continued)

(58) Field of Classification Search
CPC ...... H01Q 1/24; H01Q 5/328; H01Q 15/0066; H04B 1/18; H04B 1/48; H04B 1/0458; H03F 3/189; H03F 3/195; H03F 3/245
USPC ......................................................... 343/702
See application file for complete search history.

(56) References Cited

U.S. PATENT DOCUMENTS 4,488,144 A  * 12/1984 Wollman ................ H03M 1/74
330/9
4,802,239 A  *  1/1989 Ooto ....................... H04H 40/90
333/103

(Continued)

FOREIGN PATENT DOCUMENTS

| JP | H10-084300 A | 3/1998 |
|---|---|---|
| JP | 2005-136886 A | 5/2005 |

(Continued)

*Primary Examiner* — Huedung X Mancuso
(74) *Attorney, Agent, or Firm* — Pearne & Gordon LLP

(57) ABSTRACT

A radio frequency circuit includes a switching circuit, an amplifying circuit, and a potential stabilizing circuit. The switching circuit includes a switch disposed on a path connecting a first terminal, to which a radio-frequency signal is input, to a second terminal, from which the radio-frequency signal is output, a first capacitor disposed between the first terminal and the switch, and a second capacitor disposed between the switch and the second terminal. The amplifying circuit includes an amplifier disposed between the switching circuit and the second terminal, a third capacitor disposed between the switching circuit and the amplifier, and a fourth capacitor disposed between the amplifier and the second terminal. The potential stabilizing circuit is connected to a first node which is located between the switching circuit and the amplifying circuit and which is located on a path connecting the second capacitor to the third capacitor.

14 Claims, 17 Drawing Sheets

(51) Int. Cl.
| | |
|---|---|
| *H03F 3/195* | (2006.01) |
| *H03F 3/24* | (2006.01) |
| *H04B 1/04* | (2006.01) |
| *H04B 1/48* | (2006.01) |
| *H01Q 1/50* | (2006.01) |

(52) U.S. Cl.
CPC .. *H03F 2200/108* (2013.01); *H03F 2200/249* (2013.01); *H03F 2200/294* (2013.01)

(56) References Cited

U.S. PATENT DOCUMENTS

| | | | |
|---|---|---|---|
| 5,274,343 A * | 12/1993 | Russell | ............... H03K 17/693 |
| | | | 327/427 |
| 7,595,706 B2 * | 9/2009 | Kato | ..................... H04H 40/90 |
| | | | 200/181 |
| 9,143,125 B2 * | 9/2015 | Easter | ....................... H01P 1/15 |
| 2007/0049352 A1 | 3/2007 | Nakajima et al. | |
| 2010/0301944 A1 | 12/2010 | Yamamoto et al. | |
| 2018/0145647 A1 | 3/2018 | Matsuno | |

FOREIGN PATENT DOCUMENTS

| | | |
|---|---|---|
| JP | 2009-33598 A | 2/2009 |
| JP | 2010-278521 A | 12/2010 |
| JP | 2014-33375 A | 2/2014 |
| JP | 2016-167649 A | 9/2016 |
| JP | 2007-67762 A | 3/2017 |

* cited by examiner

RADIO FREQUENCY CIRCUIT, RADIO-FREQUENCY FRONT-END CIRCUIT, AND COMMUNICATION DEVICE

This application claims priority from Japanese Patent Application No. 2017-174814 filed on Sep. 12, 2017. The content of this application is incorporated herein by reference in its entirety.

BACKGROUND

The present disclosure relates to a radio frequency circuit including a switching circuit and an amplifying circuit, a radio-frequency front-end circuit including the radio frequency circuit, and a communication device.

A communication device using wireless communication includes a radio-frequency front-end circuit having a transmitting circuit and a receiving circuit. Japanese Unexamined Patent Application Publication No. 2009-33598 discloses a radio frequency circuit (receiving circuit) as a part of a radio-frequency front-end circuit. The radio frequency circuit includes a switch and an amplifier. The switch is connected to an antenna terminal. The amplifier amplifies a receive signal received through the switch.

In a radio frequency circuit used as a part of a radio-frequency front-end circuit, when the switch and the amplifier of the radio frequency circuit are switched on so that the reception mode is on, the amplifier can rise in a short time. However, in the radio frequency circuit described in Japanese Unexamined Patent Application Publication No. 2009-33598, when the amplifier is switched on, the amplifier may rise slowly.

BRIEF SUMMARY

Accordingly, the present disclosure provides a radio frequency circuit that suppresses slowing of the rising edge of an amplifier which occurs when the amplifier is switched on.

A radio frequency circuit according to an aspect of the present disclosure comprises a switching circuit, an amplifying circuit, and a potential stabilizing circuit. The switching circuit comprises a switch, a first capacitor, and a second capacitor. The switch, the first capacitor, and the second capacitor are connected in series between a first terminal and a first node. The switch is disposed between the first capacitor and the second capacitor. The amplifying circuit comprises an amplifier, a third capacitor, and a fourth capacitor. The amplifier, the third capacitor, and the fourth capacitor are connected in series between a first terminal and a second terminal. The amplifier is disposed between the third capacitor and the fourth capacitor. The potential stabilizing circuit is connected to the first node and branches off from a path connecting the first terminal to the second terminal. The first terminal is a terminal to which a first radio-frequency signal is input. The second terminal is a terminal from which the first radio-frequency signal is output.

Thus, the potential stabilizing circuit is connected between the switching circuit and the amplifying circuit. This may suppress a change in potential which possibly occurs between the switching circuit and the amplifying circuit when the switching circuit and the amplifying circuit are switched on. Thus, a change in the potential in the amplifying circuit may be suppressed and slowing of the rising edge of the amplifier which occurs when the amplifier is switched on may be suppressed.

The first capacitor, the second capacitor, the third capacitor, and the fourth capacitor may be DC-cutting capacitors.

Accordingly, in each of the switching circuit and the amplifying circuit, direct current flow may be suppressed. This enables the role and function of each of the switching circuit and the amplifying circuit to be performed, achieving stability of the characteristics of the radio frequency circuit.

The potential stabilizing circuit may comprise an inductor. The inductor may have a first end connected to the first node and a second end connected to a ground.

Accordingly, the potential between the switching circuit and the amplifying circuit may remain stable. This enables suppression of a change in the potential in the amplifying circuit, achieving suppression of slowing of the rising edge of the amplifier which occurs when the amplifier is switched on.

The potential stabilizing circuit may comprise a resistor. The resistor may have a first end connected to the first node and a second end connected to a ground.

Accordingly, the potential between the switching circuit and the amplifying circuit may remain stable. This enables suppression of a change in the potential in the amplifying circuit, achieving suppression of slowing of the rising edge of the amplifier which occurs when the amplifier is switched on. When the resistor is integrated into an integrated circuit (IC), the area of the potential stabilizing circuit may be made smaller compared with the case in which an inductor is integrated into an IC, achieving reduction in the size of the radio frequency circuit.

A potential at a second node changes in accordance with a change in state of the switch. The second node may be between the switch and the second capacitor.

Accordingly, the second node has a different potential in accordance with switching the switch between on and off. Thus, switching the switch on or off may be assured. In contrast, for example, even when switching the switch between on and off leads to a change in the potential at the second node and charge moves into the second capacitor, a change in potential which possibly occurs between the switching circuit and the amplifying circuit may be suppressed due to the potential stabilizing circuit connected between the switching circuit and the amplifying circuit. This enables suppression of slowing of the rising edge of the amplifier which occurs when the amplifier is switched on.

A potential at the first node changes less in accordance with the change in state of the switch than the potential at the second node.

Accordingly, a change in potential which possibly occurs between the switching circuit and the amplifying circuit may be suppressed when the switching circuit and the amplifying circuit are switched on. Thus, a change in the potential in the amplifying circuit may be suppressed and slowing of the rising edge of the amplifier which occurs when the amplifier is switched on may be suppressed.

The radio frequency circuit may further comprise a bypass switch that is connected in parallel with the amplifying circuit. The bypass switch may have a first end connected to the first node and a second end connected between the amplifier and the second terminal.

Accordingly, even when the bypass switch is disposed parallel to the amplifying circuit, the potential stabilizing circuit is disposed between the switching circuit and the amplifying circuit. Therefore, a change in the potential between the switching circuit and the amplifying circuit which possibly occurs when the bypass switch is switched may be suppressed. This enables suppression of a change in the potential in the amplifying circuit, achieving suppression of slowing of the rising edge of the amplifier which occurs when the amplifier is switched on.

The bypass switch may be a field-effect transistor.

For example, charge accumulated in the field-effect transistor while the bypass switch is on may be discharged when the bypass switch is off. However, in the radio frequency circuit according to the aspect of the present disclosure, the potential stabilizing circuit is disposed between the switching circuit and the amplifying circuit. Therefore, a change in the potential between the switching circuit and the amplifying circuit may be suppressed. This enables suppression of a change in the potential in the amplifying circuit, achieving suppression of slowing of the rising edge of the amplifier which occurs when the amplifier is switched on.

The radio frequency circuit may further comprise a matching inductor that is connected in series between the first node and a bias-voltage applying node of the amplifier.

Accordingly, matching between the switching circuit and the amplifier may be performed.

A radio-frequency front-end circuit according to an aspect of the present disclosure comprises a receiving circuit, the first terminal, the second terminal, a third terminal, a third node, a filter, and a transmitting circuit. The receiving circuit comprises the radio frequency circuit described above. The third terminal receives a second radio-frequency signal different from the first radio-frequency signal. The third node is disposed between the first terminal and the switching circuit. The filter is disposed between the first terminal and the third node. The transmitting circuit is disposed on a path connecting the third node to the third terminal. The amplifier is a low noise amplifier. The first terminal is connected to an antenna. The second terminal outputs the radio-frequency signal from the receiving circuit.

The radio-frequency front-end circuit includes the radio frequency circuit. Thus, the rising time of the low noise amplifier (LNA) which is obtained when the receiving circuit is switched on may be made shorter. This enables faster switching from the transmission mode to the reception mode in the radio-frequency front-end circuit.

A communication device according to an aspect of the present disclosure comprises the radio-frequency front-end circuit, which is described above, and a signal processing circuit configured to process the first radio-frequency signal and the second radio-frequency signal.

The communication device includes the radio-frequency front-end circuit, achieving quicker communication response of the communication device.

A radio frequency circuit and the like provided by the present disclosure enable suppression of slowing of the rising of an amplifier which occurs when the amplifier is switched on.

Other features, elements, characteristics and advantages of the present disclosure will become more apparent from the following detailed description of embodiments of the present disclosure with reference to the attached drawings.

DETAILED DESCRIPTION

First Knowledge Based on the Present Disclosure

Figure 1:
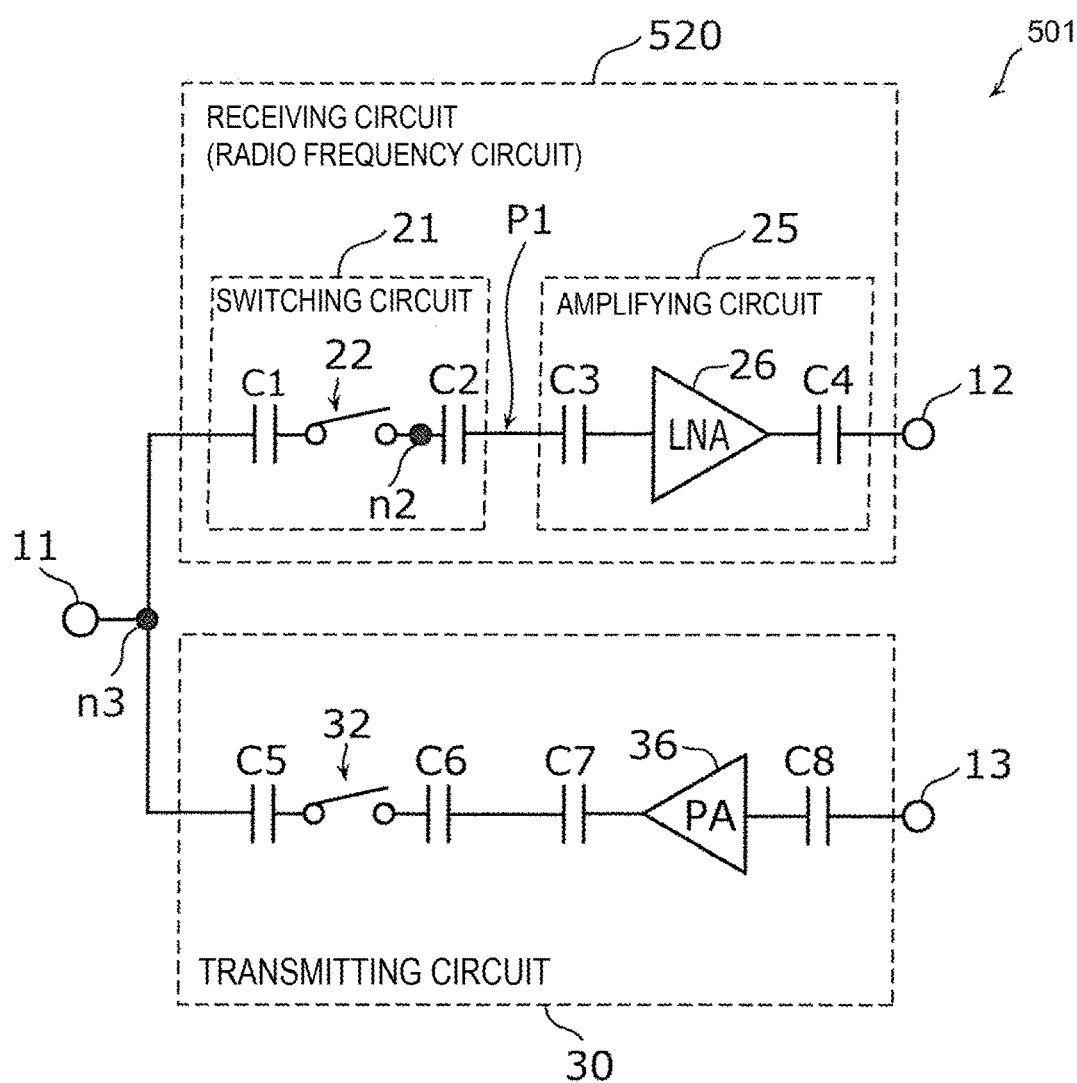
FIG. 1 is a diagram illustrating the functional block configuration of a radio-frequency front-end circuit according to a first comparison example.

Among first knowledge and second knowledge based on the present disclosure, the first knowledge will be described by taking, as an example, a radio-frequency front-end circuit 501 according to a first comparison example. FIG. 1 is a diagram illustrating the functional block configuration of the radio-frequency front-end circuit 501 according to the first comparison example.

The radio-frequency front-end circuit 501 according to the first comparison example includes a receiving circuit 520 and a transmitting circuit 30. The radio-frequency front-end circuit 501 also includes a first terminal 11 through which a receive signal is input and through which a transmit signal is output, a second terminal 12 through which a receive signal received through the first terminal 11 is output, and a third terminal 13 through which a transmit signal is received. The receiving circuit 520 is disposed on the path connecting the first terminal 11 to the second terminal 12. The transmitting circuit 30 is disposed on the path connecting the first terminal 11 to the third terminal 13. The receiving circuit 520 is connected to the transmitting circuit 30 at a third node n3 located between the first terminal 11 and the receiving circuit 520.

The transmitting circuit 30 includes a power amplifier (PA) 36 that amplifies a transmit signal received through the third terminal 13, and a switch 32 that switches, between on and off, signal output of the transmitting circuit 30. Direct current (DC) cutting capacitors C5 and C6 are disposed on the output side and the input side, respectively, of the switch 32. DC-cutting capacitors C7 and C8 are disposed on the output side and the input side, respectively, of the PA 36.

The receiving circuit 520 includes a switching circuit 21 and an amplifying circuit 25 connected to the switching circuit 21. The switching circuit 21 includes a switch 22 that switches, between on and off, input of a receive signal received from the first terminal 11, and DC-cutting capacitors C1 and C2 disposed on the input side and the output side, respectively, of the switch 22. The amplifying circuit 25 includes an amplifier 26 that amplifies a receive signal received through the switch 22, and DC-cutting capacitors C3 and C4 disposed on the input side and the output side, respectively, of the amplifier 26. The amplifier 26 is, for example, a low noise amplifier (LNA).

In the radio-frequency front-end circuit 501 according to the first comparison example, when the transmitting circuit 30 is on, the receiving circuit 520 is off. When the receiving circuit 520 is on, the transmitting circuit 30 is off.

Figure 2:
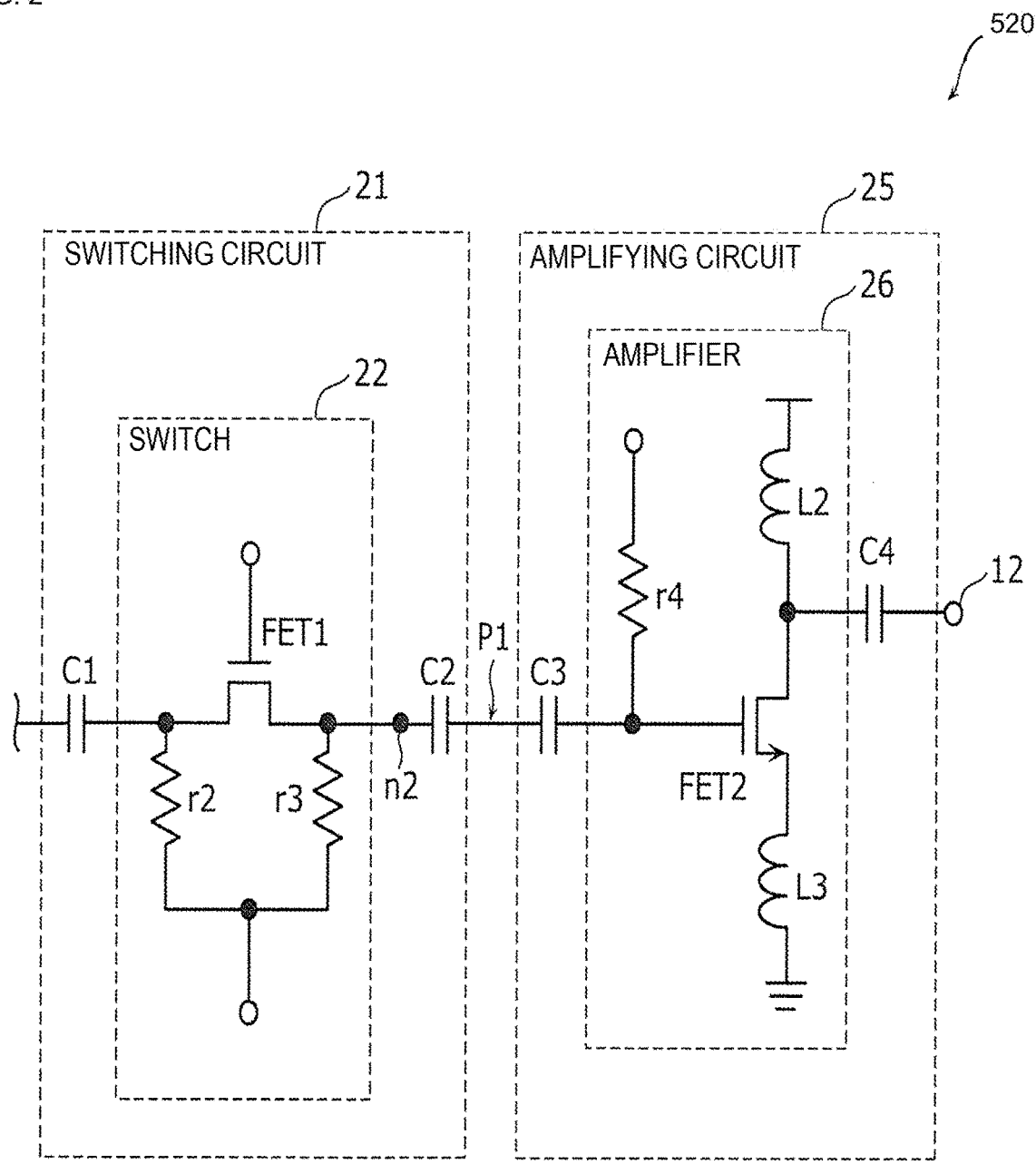
FIG. 2 is a diagram illustrating an exemplary receiving circuit according to the first comparison example.

Referring to FIG. 2, the receiving circuit 520 according to the first comparison example will be described in detail. FIG. 2 is a diagram illustrating an exemplary receiving circuit 520.

The switch 22 of the switching circuit 21 includes an n-type field-effect transistor FET1 that is an exemplary switching device, a resistor r2 connected to the drain of the transistor FET1, and a resistor r3 connected to the source. In the switch 22, when a 0-V gate voltage is applied to the transistor FET1, that is, the transistor FET1 is off, some voltage is applied to the source of the transistor FET1. Thus, the potential (for example, 2.5 V) at a second node n2 on the path connecting the switch 22 to the second capacitor C2 remains higher than the gate voltage (0 V). Accordingly, interruption of a receive signal is assured. In addition, a gate voltage applied to the transistor FET1 causes the switch 22 to be switched on (for example, the gate voltage is 2.5 V). At that time, a 0-V voltage is applied to the source of the transistor FET1, and the potential at the second node n2 becomes 0 V, enabling a receive signal to pass through.

The amplifier 26 of the amplifying circuit 25 includes a field-effect transistor FET2 that is an exemplary amplifying device, a resistor r4 connected to the gate of the transistor FET2, an inductor L2 connected to the drain, and an inductor L3 connected to the source.

When a bias voltage equal to or greater than a threshold is not applied to the gate of the transistor FET2, that is, the transistor FET2 is off, the amplifier 26 does not pass and amplify a receive signal. When a bias voltage equal to or greater than a threshold is applied to the gate of the transistor FET2, the amplifier 26 is switched on, and a drain current flows between the drain and the source. A receive signal received by the amplifier 26 is amplified by using the drain current, and the resulting current is output from the second terminal 12 through the capacitor C4. In the first comparison example, a bias voltage for switching off the amplifier 26 is 0 V; and a bias voltage for switching on the amplifier 26 is about 0.5 V.

Figure 3A:
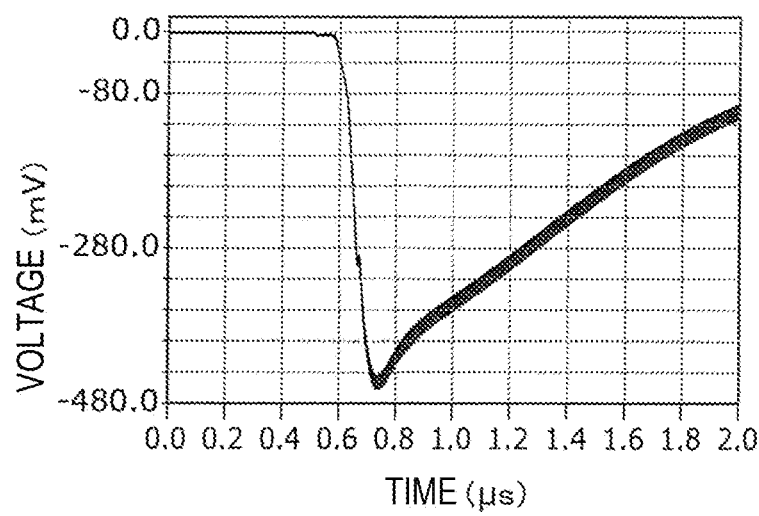
FIGS. 3A to 3C are diagrams illustrating data of a receiving circuit according to the first comparison example.
Figure 3B:
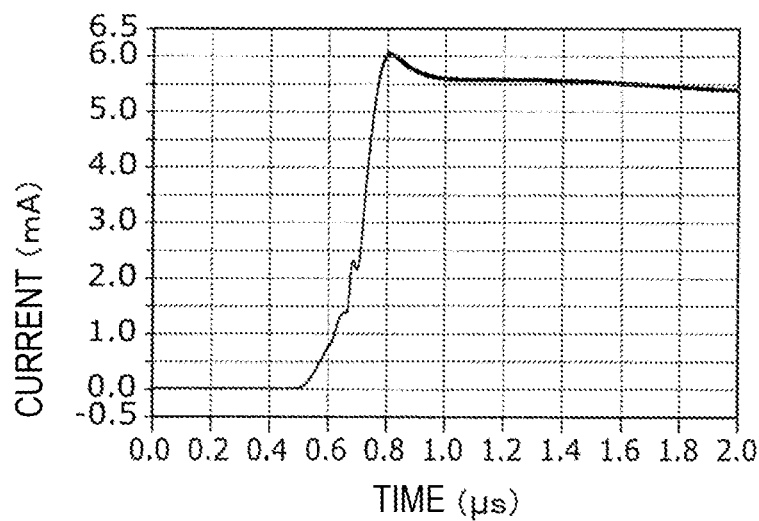
Figure 3C:
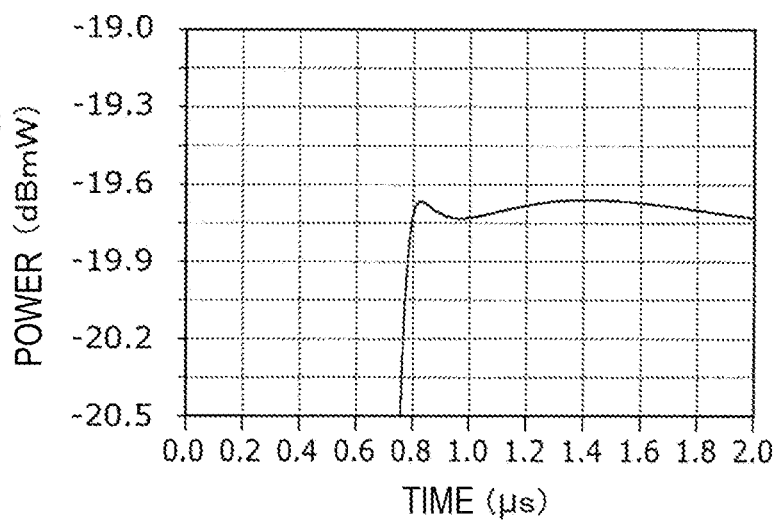

Referring to FIGS. 3A to 3C, problems arising when the switch 22 and the amplifier 26 are switched on in the receiving circuit 520 according to the first comparison example will be described.

FIGS. 3A to 3C are diagrams illustrating data of the receiving circuit 520 according to the first comparison example. FIGS. 3A to 3C illustrate the case in which the switch 22 and the amplifier 26 are switched from off to on at time 0.5 μs (hereinafter referred to as the case in which the receiving circuit 520 is switched on).

FIG. 3A is a diagram illustrating a change in the voltage (potential) at a fixed point P1 located between the switching circuit 21 and the amplifying circuit 25. As illustrated in FIG. 3A, when the receiving circuit 520 is switched on, the voltage at the fixed point P1 changes from 0 V to about −460 mV. After that, the voltage rises toward 0 V. However, even at time 2.0 μs, the voltage does not reach 0 V. Thus, in the first comparison example, when the receiving circuit 520 is switched on, a voltage drop occurs at the fixed point P1, and the voltage drop continues for a long time (about 1.3 μs or longer).

FIG. 3B is a diagram illustrating a change in the drain current of the transistor FET2. As illustrated in FIG. 3B, when the receiving circuit 520 is switched on, the drain current increases from 0 mA, and an overshoot occurs at time 0.8 μs. After that, the current value decreases gradually. However, even at time 2.0 μs, the current value does not decrease to the required drain current value (about 5.2 mA). Thus, in the receiving circuit 520 according to the first comparison example, an overshoot occurs in the drain current of the transistor FET2, and the state in which the drain current value is high continues for a long time (about 1.3 μs or longer).

FIG. 3C is a diagram illustrating a change in the output voltage of the amplifier 26. As illustrated in FIG. 3C, when the receiving circuit 520 is switched on, an overshoot of the output voltage of the amplifier 26 occurs at time 0.8 μs. After that, the output voltage remains unstable. Thus, in the receiving circuit 520 according to the first comparison example, the amplifier 26 rises slowly.

A reason and the like why the rising edge of the amplifier 26 is slowed will be discussed.

When the switch 22 is switched from off to on, the potential at the second node n2 changes from about 2.5 V to 0 V. In response to this change, the capacitor C2 operates so as to maintain about 2.5 V which is the original potential difference of the capacitor C2. Part of charge moves toward the electrode on the second node n2 side. This may cause a voltage drop of about 460 mV to occur, as illustrated in FIG. 3A, on a line located on the side opposite to the second node n2 with respect to the capacitor C2, for example, at the fixed point P1 positioned between the capacitor C2 and the capacitor C3.

The voltage drop at the fixed point P1 causes part of charge in the capacitor C3 to move to the fixed point P1 side, resulting in occurrence of a slight voltage drop also on the transistor FET2's gate side. When the amplifier 26 is switched on, a bias voltage is applied to the gate of the transistor FET2. The above-described voltage drop on the gate side causes a temporary decrease in the voltage applied to the gate. This may cause the rising edge of the drain current to be slowed in the first comparison example (see FIG. 3B and FIG. 7B). To compensate for the slowing of the rising edge, the bias voltage is controlled so as to be higher than necessary. This may cause occurrence of an overshoot of the drain current as illustrated in FIG. 3B.

The discussion described above leads to the following solution: for example, suppression of a voltage drop at the fixed point P1 of the receiving circuit 520 may result in suppression of the slowing of the rising edge of the drain current.

A receiving circuit (radio frequency circuit) according to a first embodiment includes a potential stabilizing circuit that maintains stability of the potential at the fixed point P1, that is, the potential between the switching circuit 21 and the amplifying circuit 25. Thus, the receiving circuit according to the first embodiment may suppress a change in the potential in the amplifying circuit 25 and may suppress delay in the rising time of the amplifier 26 which occurs when the amplifier 26 is switched on.

How to carry out the present disclosure will be described in detail by using embodiments and the drawings. The embodiments described below indicate comprehensive or concrete examples. The values, shapes, materials, components, arrangement and connection configuration of the components, and the like which are indicated in the embodiments described below are exemplary and are not intended to limit the present disclosure. Among the components in the embodiments described below, components which are not described in the independent claims are described as optional components. The size and the ratio in the size of a component which are illustrated in the drawings are not necessarily exact.

First Embodiment

A radio-frequency front-end circuit 1 according to the first embodiment is disposed in a communication device using a wireless LAN. In the wireless LAN, for example, a radio-frequency signal in the 2.4-GHz band or the 5-GHz band defined in the IEEE802.11 standard is used.

Referring to FIGS. 4 to 7C, the radio-frequency front-end circuit 1 according to the first embodiment will be described. The same components in the first comparison example are used in the first embodiment. The components including the same components will be described as those in the first embodiment.

Figure 4:
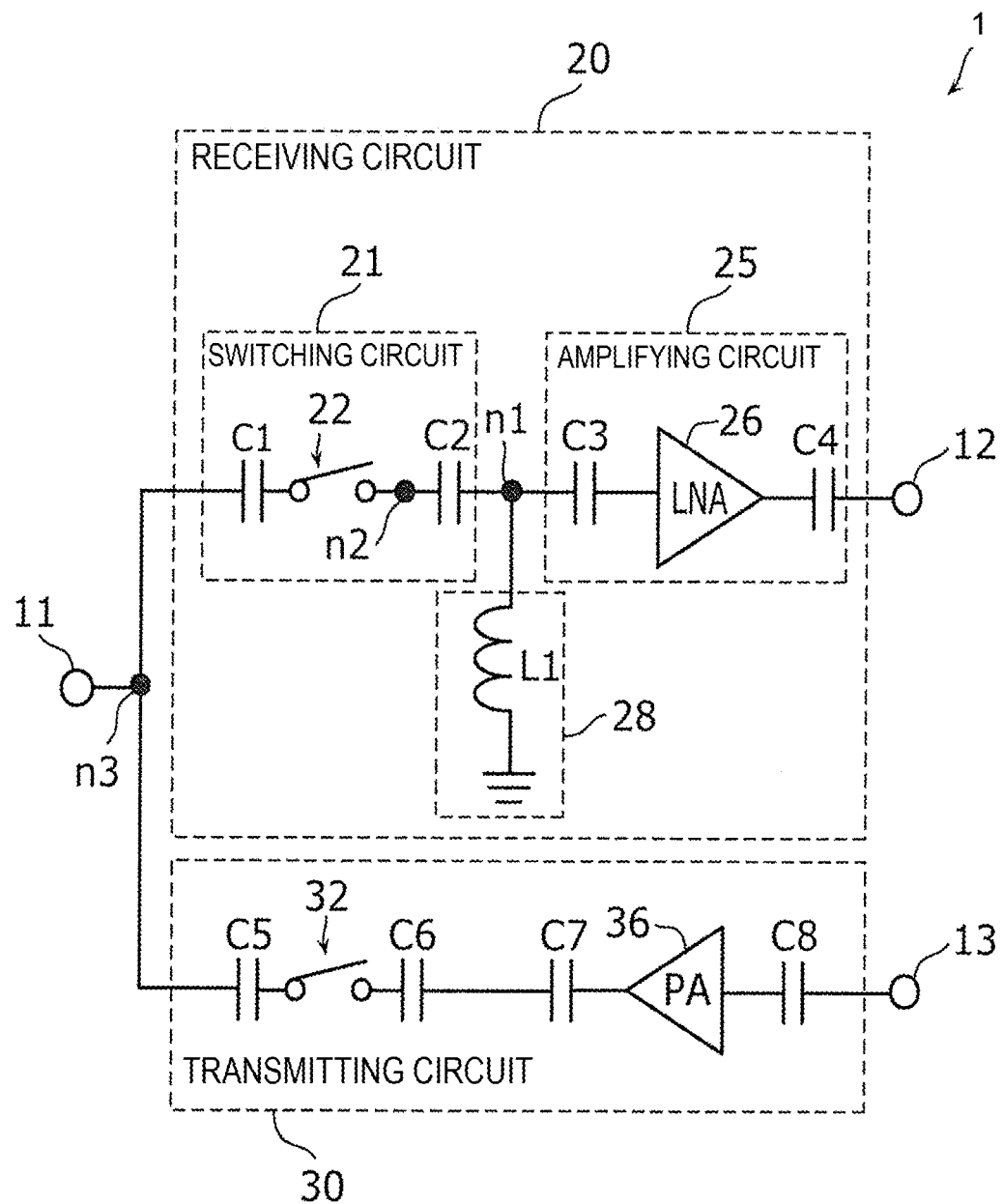
FIG. 4 is a diagram illustrating the functional block configuration of a radio-frequency front-end circuit according to a first embodiment.
Figure 5A:
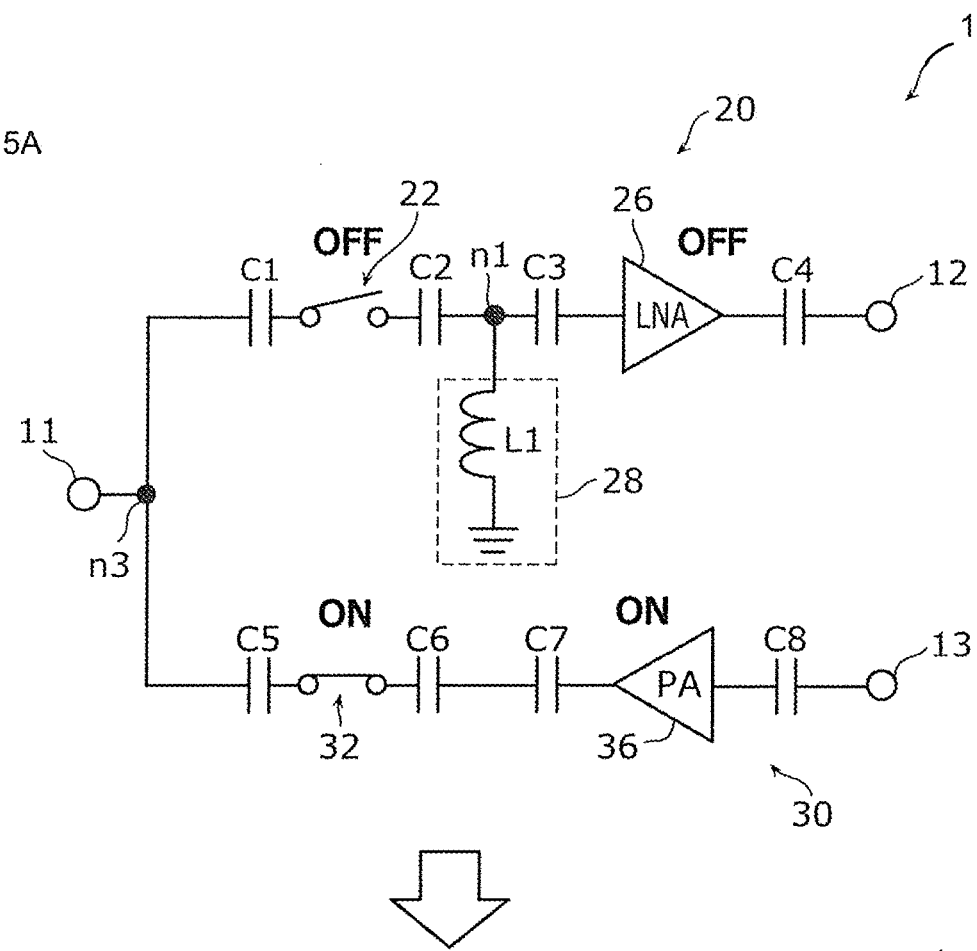
FIGS. 5A and 5B are diagrams illustrating operations of a radio-frequency front-end circuit according to the first embodiment.
Figure 5B:
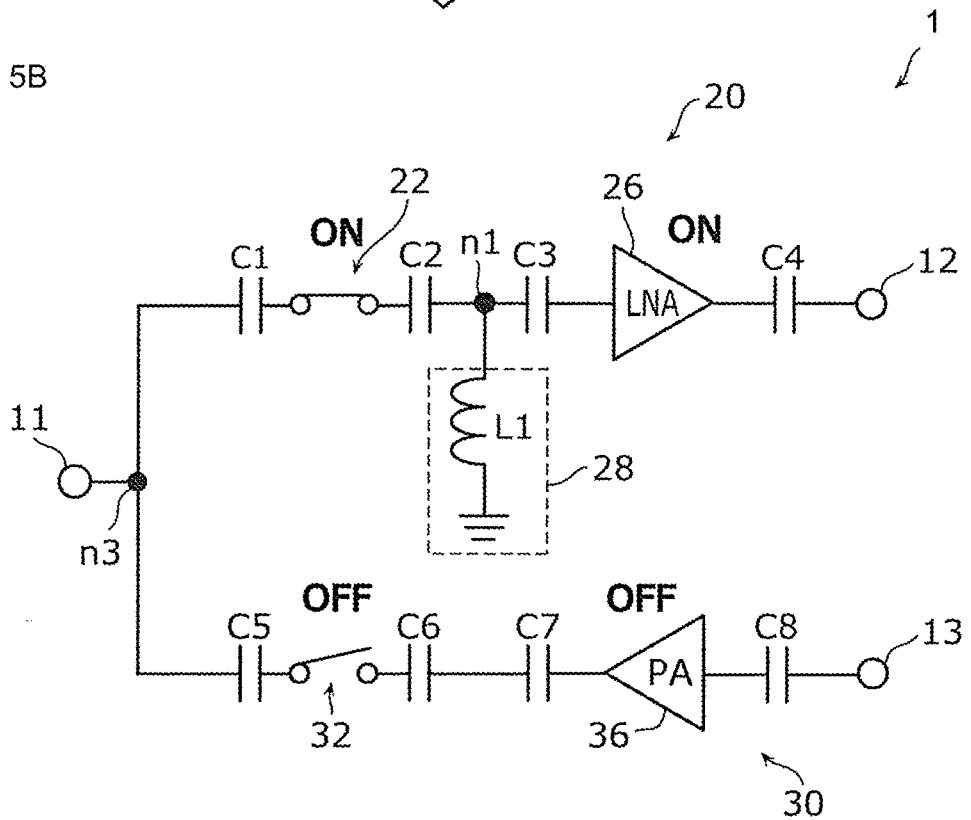
Figure 6:
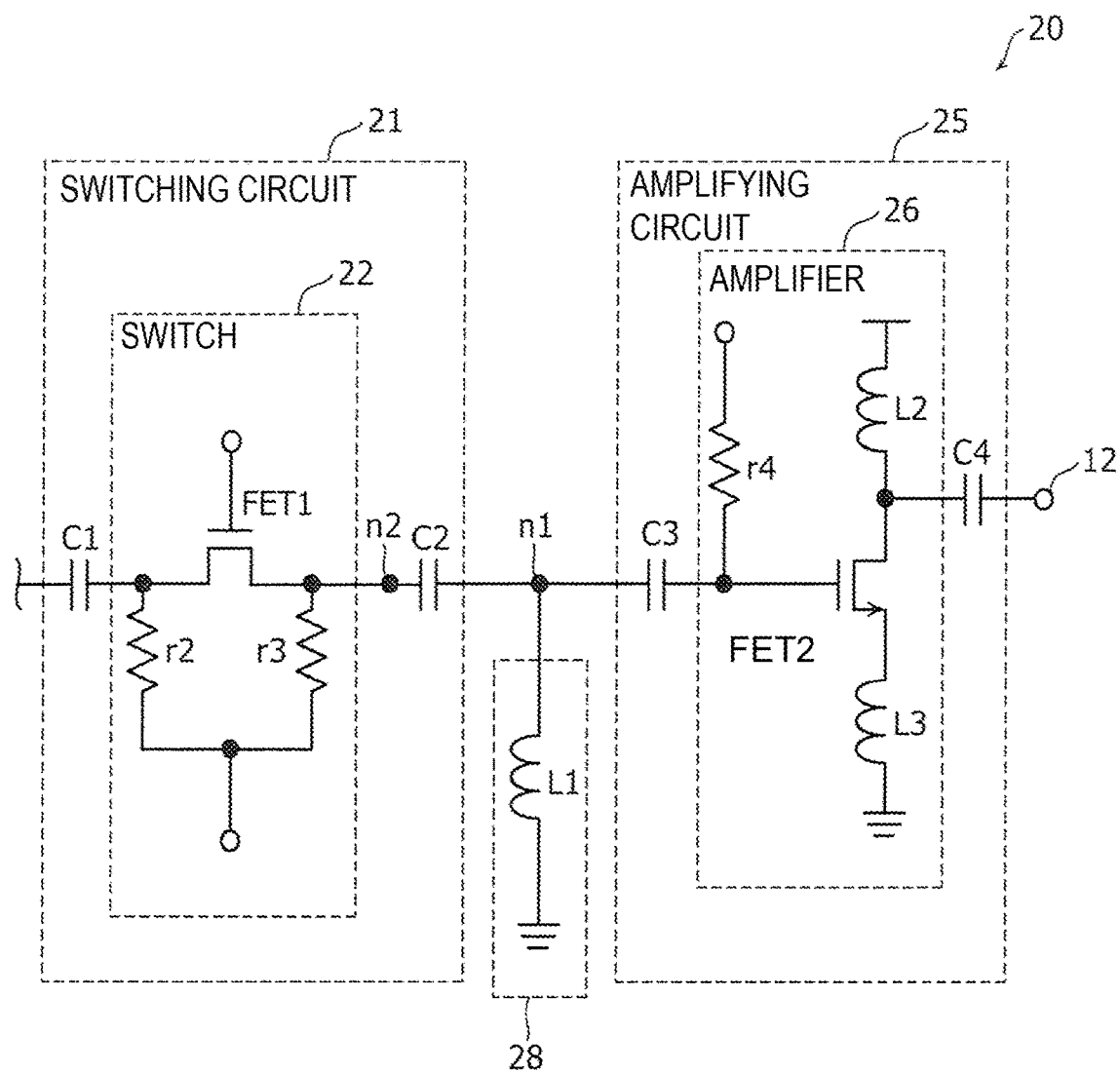
FIG. 6 is a diagram illustrating an exemplary receiving circuit according to the first embodiment.
Figure 7A:
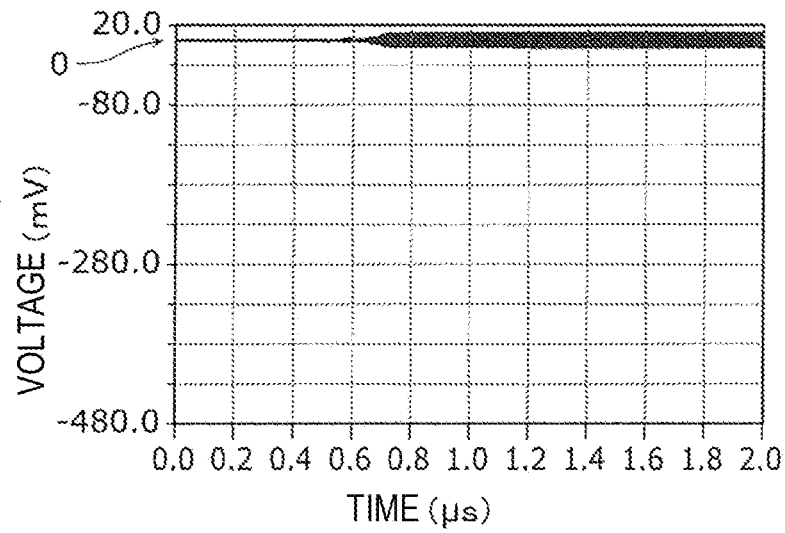
FIGS. 7A to 7C are diagrams illustrating data of a receiving circuit according to the first embodiment.
Figure 7B:
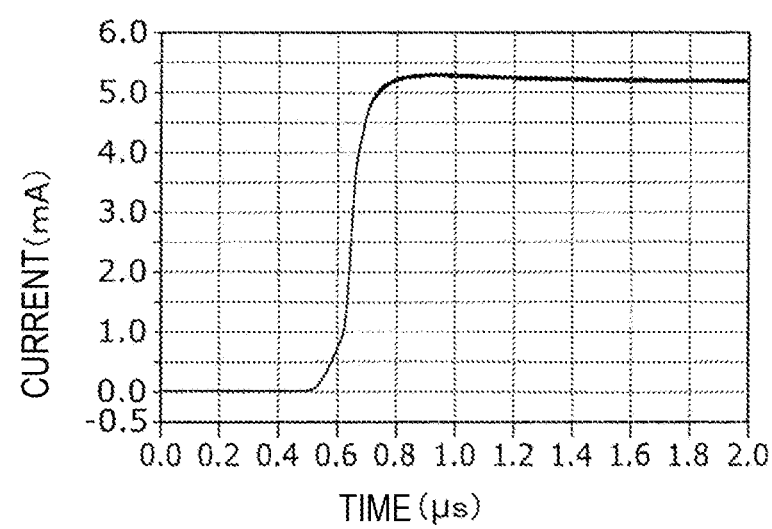
Figure 7C:
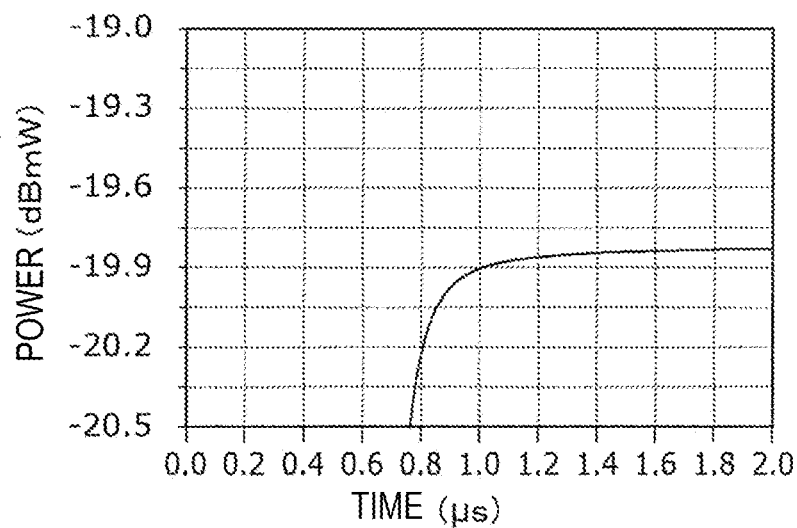

FIG. 4 is a diagram illustrating the functional block configuration of the radio-frequency front-end circuit 1. FIGS. 5A and 5B are diagrams illustrating operations of the radio-frequency front-end circuit 1. FIG. 6 is a diagram illustrating an exemplary receiving circuit 20. FIGS. 7A to 7C are diagrams illustrating data of the receiving circuit 20.

As illustrated in FIG. 4, the radio-frequency front-end circuit 1 includes the receiving circuit 20 and the transmitting circuit 30. The radio-frequency front-end circuit 1 also includes the first terminal 11 through which a receive signal (a first radio-frequency signal) is input and through which a transmit signal (a second radio-frequency signal) is output, the second terminal 12 through which a receive signal received through the first terminal 11 is output, and the third terminal 13 through which a transmit signal is received. The receiving circuit 20 is disposed on the path connecting the first terminal 11 to the second terminal 12. The transmitting circuit 30 is disposed on the path connecting the first terminal 11 to the third terminal 13. The receiving circuit 20 is connected to the transmitting circuit 30 at the third node n3 located between the first terminal 11 and the receiving circuit 20.

The transmitting circuit 30 includes the PA 36 that amplifies a transmit signal received from the third terminal 13, and the switch 32 that switches, between on and off, signal output of the transmitting circuit 30. The DC-cutting capacitors C5 and C6 are disposed on the output side and the input side, respectively, of the switch 32. The DC-cutting capacitors C7 and C8 are disposed on the output side and the input side, respectively, of the PA 36.

The receiving circuit 20 includes the switching circuit 21 and the amplifying circuit 25 connected to the switching circuit 21. The receiving circuit 20 according to the first embodiment also includes a potential stabilizing circuit 28 connected to the path between the switching circuit 21 and the amplifying circuit 25.

The switching circuit 21 includes the switch 22 that switches, between on and off, input of a receive signal received through the first terminal 11, and the first capacitor C1 and the second capacitor C2 which are used to cut DC and which are disposed on the input side and the output side, respectively, of the switch 22. Specifically, the first capacitor C1 is disposed between the first terminal 11 and the switch 22. The second capacitor C2 is disposed between the switch 22 and the second terminal 12. In other words, the switch 22, the first capacitor C1, and the second capacitor C2 are connected in series between the first terminal 11 and the second terminal 12, to be specific, between the first terminal 11 and a first node n1 described below. The first capacitor C1 and the second capacitor C2 have the same capacitance. The second capacitor C2 has a capacitance greater than the capacitance of a capacitor used in a filter circuit or the like, and has, for example, a capacitance equal to or greater than about 1 µF and equal to or less than about 10 µF. As the capacitors C1 and C2, for example, multilayer ceramic capacitors are used.

The amplifying circuit 25 includes the amplifier 26 that amplifies a receive signal received through the switch 22, and the third capacitor C3 and the fourth capacitor C4 which are used to cut DC and which are disposed on the input side and the output side, respectively, of the amplifier 26. Specifically, the third capacitor C3 is disposed between the switching circuit 21 and the amplifier 26, and the fourth capacitor C4 is disposed between the amplifier 26 and the second terminal 12. In other words, the amplifier 26, the third capacitor C3, and the fourth capacitor C4 are connected in series between the first terminal 11 and the second terminal 12, to be specific, between the first node n1 described below and the second terminal 12. The third capacitor C3 and the fourth capacitor C4 have the same capacitance. As the capacitors C3 and C4, for example, multilayer ceramic capacitors are used.

The potential stabilizing circuit 28 is connected to a first node n1 on the path connecting the second capacitor C2 to the third capacitor C3. In other words, the potential stabilizing circuit 28 branches off from the path connecting the first terminal to the second terminal. The potential stabilizing circuit 28 includes, for example, an inductor L1. When the potential stabilizing circuit 28 includes the inductor L1, the inductor L1 is connected to the first node n1 at one end and is connected to the ground at the other end. The inductance value of the inductor L1 is, for example, 100 nH, and the impedance is greater than about 50Ω. As the inductor L1, for example, a multilayer chip inductor is used.

As illustrated in FIGS. 5A and 5B, the radio-frequency front-end circuit 1 exerts control so that, when the transmitting circuit 30 is on, the receiving circuit 20 is off; and, when the receiving circuit 20 is on, the transmitting circuit 30 is off. When the receiving circuit 20 is switched off, as illustrated in FIG. 5A, both of the switch 22 and the amplifier 26 are switched off. As illustrated in FIG. 5B, when the receiving circuit 20 is switched on, both of the switch 22 and the amplifier 26 are switched on.

Referring to FIG. 6, the receiving circuit 20 will be described in detail.

The switch 22 of the switching circuit 21 includes the n-type transistor FET1 that is an exemplary switching device, the resistor r2 connected to the drain of the transistor FET1, and the resistor r3 connected to the source. The transistor FET1 is not limited to the n-type, and may be a p-type field-effect transistor.

In the switch 22, when a gate voltage is not applied to the transistor FET1, that is, when the transistor FET1 is off (for example, when the gate voltage is 0 V), a voltage is applied to the source and the drain of the transistor FET1. Thus, the potential at the second node n2 on the path connecting the switch 22 to the second capacitor C2 remains higher (for example, 2.5 V) than the gate voltage (0 V). Accordingly, interruption of a receive signal is assured. In addition, a gate voltage applied to the transistor FET1 causes the switch 22 to be switched on (for example, the gate voltage is 2.5 V). At that time, no voltage is applied to the source and the drain of the transistor FET1 (that is, 0 V), and the potential at the second node n2 becomes 0 V, enabling a receive signal to pass through.

The potential at the second node n2 is different in accordance with the switch 22 switched between on and off. In other words, the potential at the second node n2 changes in accordance with a change in state of the switch 22. Specifically, the potential at the second node n2 is about 2.5 V when the switch 22 is off and is 0 V when the switch 22 is on. The potential difference at the second node n2 is about 2.5 V when the switch 22 is switched between on and off and is greater than a bias voltage (about 0.5 V) applied to the gate of the transistor FET2 described below. Alternatively, the potential difference at the second node n2 may be, for example, 1.8 V, and may be less than a bias voltage (2.5 V) applied to the gate of the transistor FET2 described below.

The amplifier 26 of the amplifying circuit 25 includes the transistor FET2 that is an exemplary amplifying device, the resistor r4 connected to the gate of the transistor FET2, the inductor L2 connected to the drain, and the inductor L3 connected to the source. The inductor L2 and the capacitor C4 function as a matching circuit of the transistor FET2. The amplifying device described above is not limited to a field-effect transistor and may be a bipolar transistor.

When a bias voltage equal to or greater than the threshold is not applied to the gate of the transistor FET2, that is, the transistor FET2 is off, the amplifier 26 does not pass and amplify a receive signal. When a bias voltage equal to or greater than the threshold is applied to the gate of the transistor FET2, the amplifier 26 is switched on, and a drain current flows between the drain and the source. A receive signal received by the amplifier 26 is amplified by using the drain current, and the resulting current is output from the second terminal 12 through the capacitor C4. In the first embodiment, a bias voltage for switching off the amplifier 26 is 0 V; and a bias voltage for switching on the amplifier 26 is about 0.5 V.

Referring to FIGS. 7A to 7C, data obtained when the switch 22 and the amplifier 26 are switched on in the receiving circuit 20 according to the first embodiment will be described. FIGS. 7A to 7C illustrate the case in which the switch 22 and the amplifier 26 are switched from off to on at time 0.5 μs (hereinafter referred to as the case in which the receiving circuit 20 is switched on).

FIG. 7A illustrates a change in the voltage (potential) at the first node n1. As illustrated in FIG. 7A, the voltage at the first node n1 remains at 0 V even when the receiving circuit 20 is switched on. Thus, in the receiving circuit 20 according to the first embodiment, a voltage drop occurring in the first comparison example hardly occurs. The reason why a voltage drop hardly occurs may be that the potential stabilizing circuit 28 connected to the first node n1 suppresses a change in potential which occurs between the second capacitor C2 and the third capacitor C3. Thus, due to the potential stabilizing circuit 28 connected to the first node n1, the change amount (about 0 V) in the potential at the first node n1 in accordance with the switch 22 switched between on and off is less than the change amount (about 2.5 V) in the potential at the second node n2 in accordance with the switch 22 switched between on and off. In other words, the potential at the first node n1 changes less in accordance with the change in state of the switch 22 than the potential at the second node n2, which changes in accordance with the change in state of the switch 22. In FIG. 7A, the voltage fluctuates near 0 V. This is because the radio frequency wave of a receive signal appears as a waveform.

FIG. 7B is a diagram illustrating a change in the drain current of the transistor FET2. As illustrated in FIG. 7B, when the receiving circuit 20 is switched on, the drain current increases smoothly from 0 mA, and reaches the required drain current value (about 5.2 mA) at time 1.0 μs. In the receiving circuit 20 according to the first embodiment, the drain current rises more rapidly compared with the first comparison example, and an overshoot of the drain current as in the first comparison example hardly occurs.

FIG. 7C is a diagram illustrating a change in the output voltage of the amplifier 26. As illustrated in FIG. 7C, when the receiving circuit 20 is switched on, the output voltage of the amplifier 26 rises stably. The receiving circuit 20 according to the first embodiment enables avoidance of slowing of the rising edge of the amplifier 26 as in the first comparison example.

In the receiving circuit (radio frequency circuit) 20 according to the first embodiment, the potential stabilizing circuit 28 is connected to the first node n1 between the switching circuit 21 and the amplifying circuit 25. This enables suppression of a change in potential which possibly occurs between the switching circuit 21 and the amplifying circuit 25. Thus, a change in the potential in the amplifying circuit 25 may be suppressed. Compared with the receiving circuit 520 according to the first comparison example, slowing of the rising edge of the amplifier 26 which occurs when the amplifier 26 is switched on may be suppressed.

Modified Example of the First Embodiment

A radio-frequency front-end circuit 1A according to a modified example of the first embodiment has the potential stabilizing circuit 28 including a pull-down resistor (that is, a resistor which does not necessarily have a resistance of about 50Ω).

Figure 8:
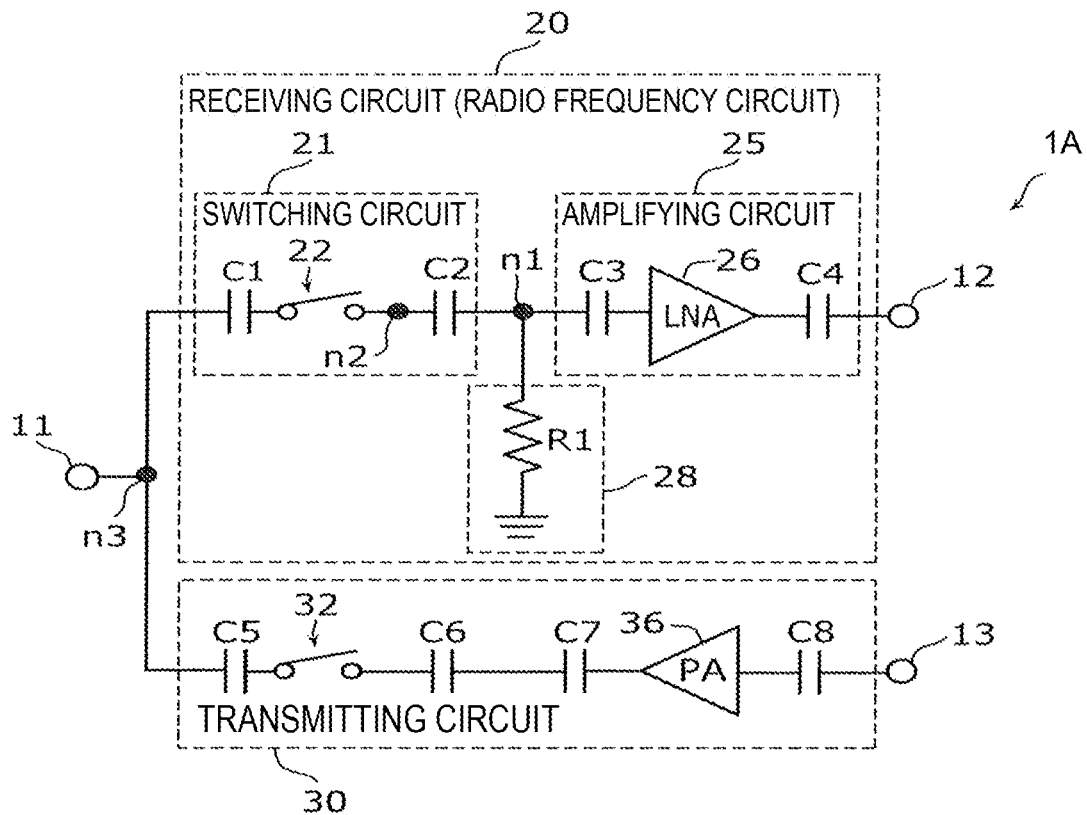
FIG. 8 is a diagram illustrating a radio-frequency front-end circuit according to a modified example of the first embodiment.

FIG. 8 is a diagram illustrating the radio-frequency front-end circuit 1A according to the modified example of the first embodiment. The receiving circuit 20 of the radio-frequency front-end circuit 1A includes the switching circuit 21, the amplifying circuit 25 connected the switching circuit 21, and the potential stabilizing circuit 28 connected on the path between the switching circuit 21 and the amplifying circuit 25.

The potential stabilizing circuit 28 according to the modified example includes, for example, a resistor R1. The resistor R1 is connected to the first node n1 at one end and is connected to the ground at the other end. When the resistor R1 is integrated into an integrated circuit (IC), compared with the case in which the inductor L1 is integrated into an IC, the area of the potential stabilizing circuit 28 may be made small, and the radio frequency circuit 20 may be reduced in size.

Also in the modified example, a change in potential which possibly occurs between the switching circuit 21 and the amplifying circuit 25 may be suppressed. This enables suppression of a change in the potential in the amplifying circuit 25 and enables suppression of slowing of the rising edge of the amplifier 26 which occurs when the amplifier 26 is switched on.

In the radio-frequency front-end circuit 1 or the radio-frequency front-end circuit 1A, for example, the inductance value of the inductor L1 or the resistance value of the resistor R1 which is used as the potential stabilizing circuit 28 is set to a larger value than the inductance value of an inductor or the resistance value of a resistor which is typically used as a matching circuit. Specifically, the resistance value of the resistor R1 is set to about 100Ω or greater. The inductance value of the inductor L1 is set to such a value that the absolute value |Z| of the impedance Z of the inductor L1 is about 100 or greater. The absolute value |Z| of the impedance Z of the inductor L1 is a value (ωL) expressed as a product of ω and L where ω indicates the angular frequency, and L indicates the inductance value of the inductor L1. Thus, the inductance value of the inductor L1 or the resistance value of the resistor R1 is set larger, achieving suppression of degradation of the noise factor of the amplifying circuit 25 which occurs due to the state in which a different circuit such as the potential stabilizing circuit 28 is connected.

Second Knowledge Based on the Present Disclosure

Figure 9:
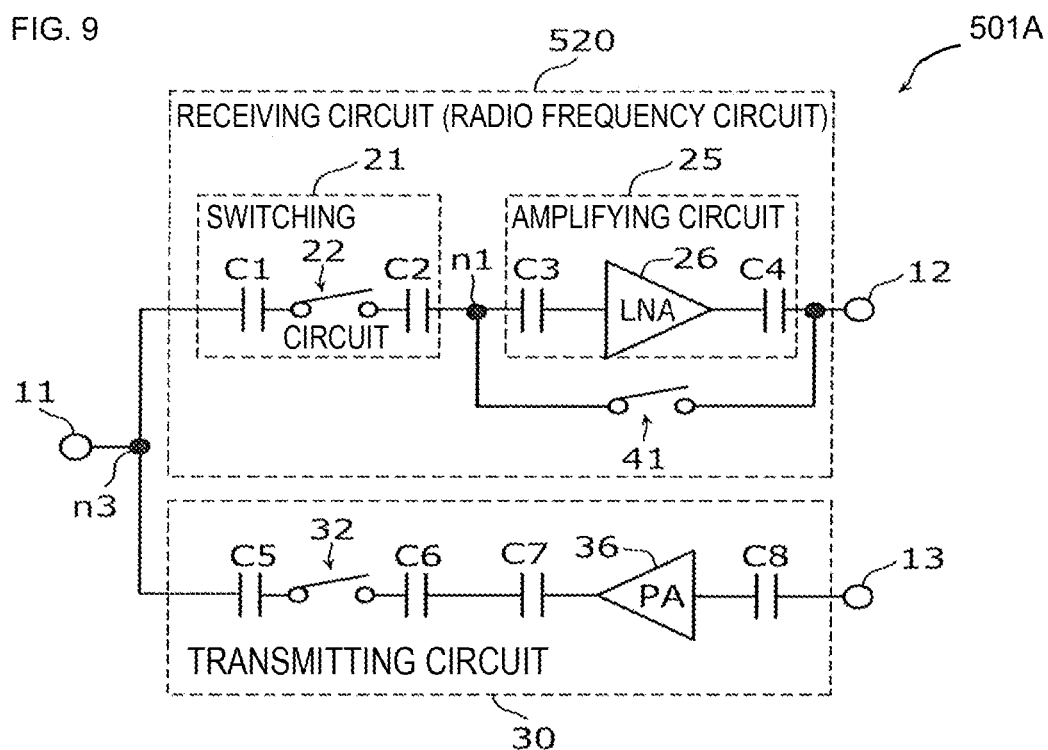
FIG. 9 is a diagram illustrating the functional block configuration of a radio-frequency front-end circuit according to a second comparison example.

The second knowledge based on the present disclosure will be described by taking, as an example, a radio-frequency front-end circuit 501A according to a second comparison example. FIG. 9 is a diagram illustrating the functional block configuration of the radio-frequency front-end circuit 501A according to the second comparison example.

The radio-frequency front-end circuit 501A according to the second comparison example includes the receiving circuit 520, the transmitting circuit 30, the first terminal 11, the second terminal 12, and the third terminal 13. The receiving circuit 520 according to the second comparison example includes the switching circuit 21 and the amplifying circuit 25, and also includes a bypass switch 41. When a large receive signal is received by the receiving circuit 520, the bypass switch 41 directs the receive signal to the second terminal 12, bypassing the amplifier 26, that is, not through the amplifier 26. The bypass switch 41 is disposed parallel to the amplifying circuit 25. The bypass switch 41 is connected to the first node n1 at one end and is connected between the amplifying circuit 25 and the second terminal 12 at the other end.

Figure 10:
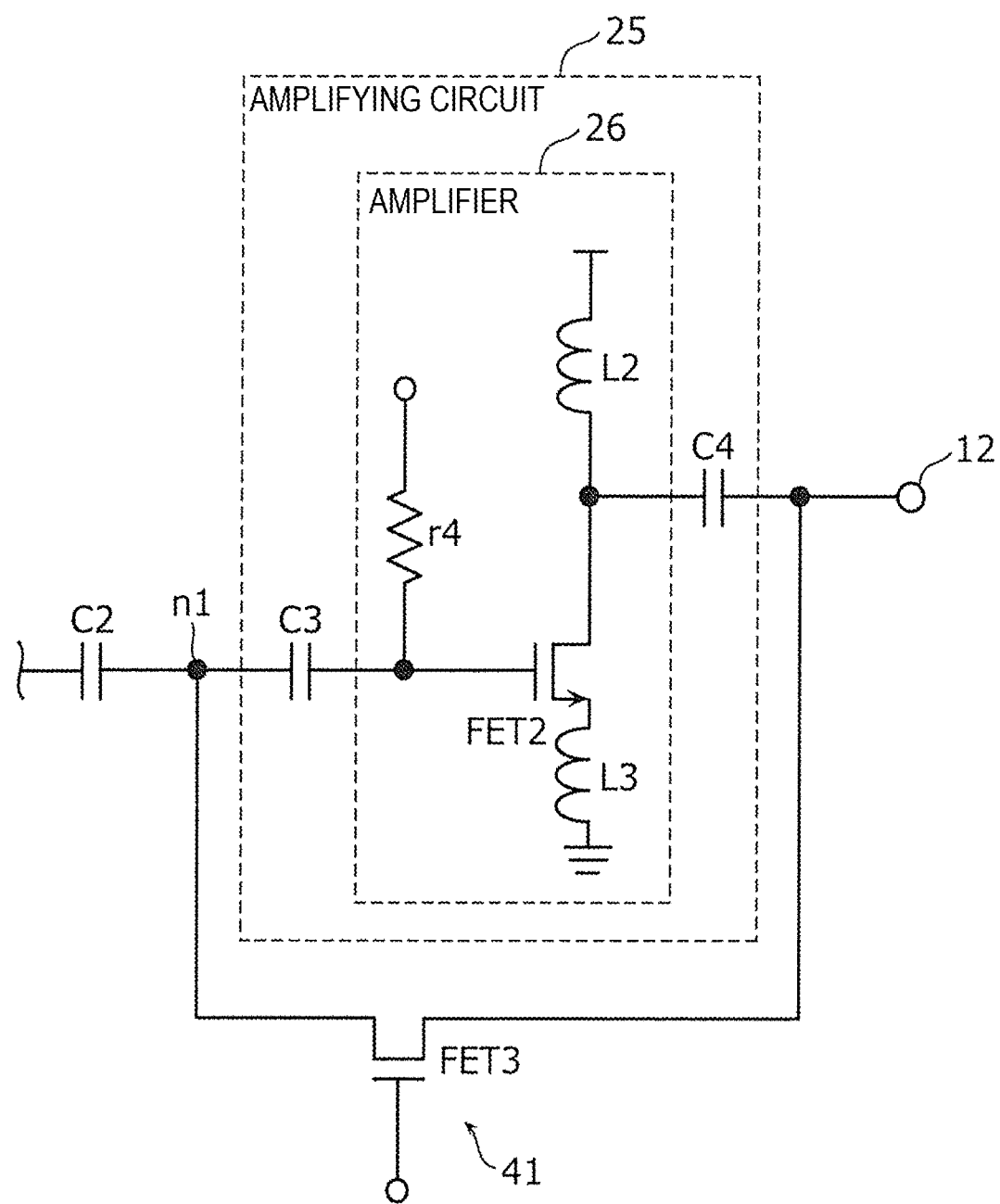
FIG. 10 is a diagram illustrating an exemplary part of a receiving circuit according to the second comparison example.

Referring to FIG. 10, the receiving circuit 520 according to the second comparison example will be described in detail. FIG. 10 is a diagram illustrating an exemplary part of the receiving circuit 520.

The bypass switch 41 includes an n-type field-effect transistor FET3 that is an exemplary switching device. When a gate voltage equal to or greater than a threshold is not applied to the transistor FET3, the bypass switch 41 is off. When a gate voltage equal to or greater than the threshold is applied to the transistor FET3, the bypass switch 41 is on.

Figure 11A:
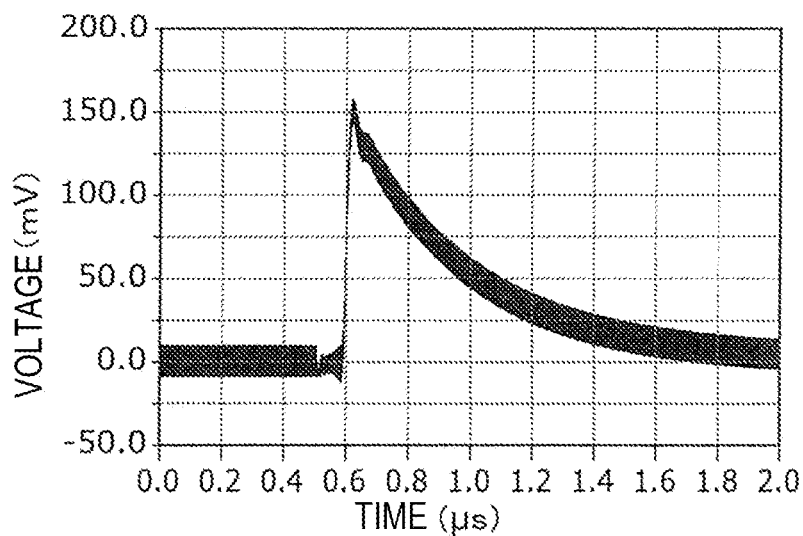
FIGS. 11A to 11C are diagrams illustrating data of a receiving circuit according to the second comparison example.
Figure 11B:
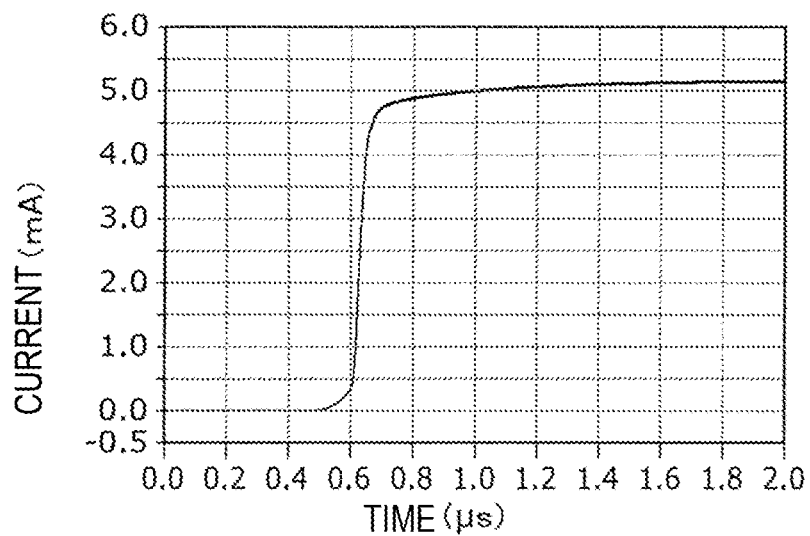
Figure 11C:
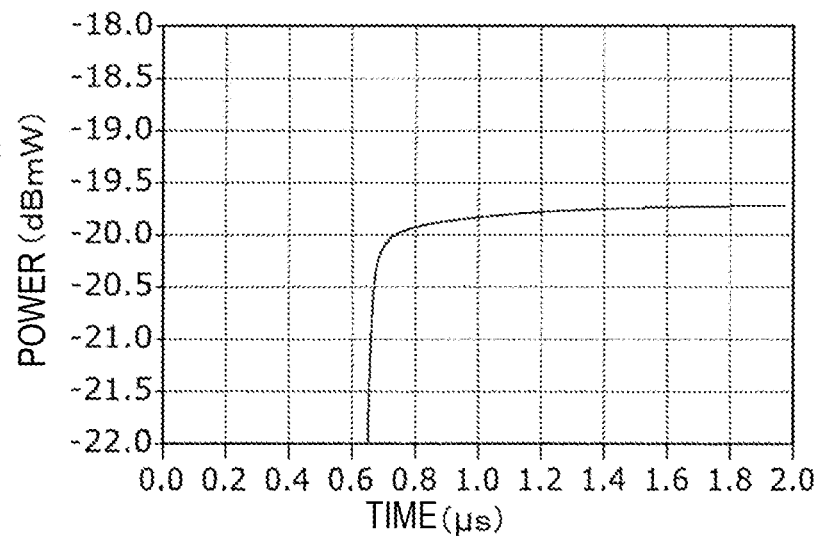

Referring to FIGS. 11A to 11C, problems arising when the bypass switch 41 is switched off and the amplifier 26 are switched on in the receiving circuit 520 according to the second comparison example will be described. In the example described below, the case in which the bypass switch 41 and the amplifier 26 are switched between on and off under the condition that the transmitting circuit 30 is off and that the switch 22 is on will be described.

FIGS. 11A to 11C are diagrams illustrating data of the receiving circuit 520 according to the second comparison example. In FIGS. 11A to 11C, at time 0.5 μs, the bypass switch 41 is switched from on to off and the amplifier 26 is switched from off to on, whereby the bypass is avoided.

FIG. 11A is a diagram illustrating a change in the voltage (potential) at the first node n1. As illustrated in FIG. 11A, avoiding the bypass causes the voltage at the first node n1 to change from 0 V to about 160 mV. After that, the voltage decreases toward 0 V, and finally reaches a value close to 0 V at time 2.0 μs. Thus, in the receiving circuit 520 according to the second comparison example, avoiding the bypass causes an increase in the voltage at the first node n1, and the increase state continues for a long time (about 1.0 μs or longer).

FIG. 11B is a diagram illustrating a change in the drain current of the transistor FET2. As illustrated in FIG. 11B, avoiding the bypass causes the drain current to increase from 0 mA. However, the drain current rises slowly. At time 2.0 μs, the drain current finally reaches the required drain current value (about 5.2 mA). Thus, in the receiving circuit 520 according to the second comparison example, the state in which the drain current of the transistor FET2 does not reach the required drain current value continues for a long time (about 1.0 μs or longer).

FIG. 11C is a diagram illustrating a change in the output voltage of the amplifier 26. As illustrated in FIG. 11C, the state in which the output voltage of the amplifier 26 is unstable continues after the bypass is avoided. Thus, in the receiving circuit 520 according to the second comparison example, the rising edge of the amplifier 26 is slowed.

A reason and the like why the rising edge of the amplifier 26 is slowed will be discussed.

When the bypass switch 41 is on, charge accumulates in the transistor FET3 having a channel structure. When the bypass switch 41 is switched from on to off, the accumulated charge is discharged toward the amplifier 26 (charge injection). As illustrated in FIG. 11A, the discharge of charge may cause a temporary voltage increase at the first node n1.

The discharged charge is interrupted by the capacitor C3, and the discharged charge does not reach the amplifier 26. After the voltage increase at the first node n1, charge moves in the capacitor C3 in the course of the process in which the voltage returns to 0 V. Accordingly, the bias voltage applied to the gate of the transistor FET2 decreases. Therefore, as illustrated in FIG. 11B, the increase of the drain current may become gentle, causing the rising edge of the amplifier 26 to be slowed.

The discussion described above leads to the following solution: for example, suppression of the voltage increase at the first node n1 of the receiving circuit 520 may result in suppression of the slowing of the rising edge of the drain current.

A receiving circuit (radio frequency circuit) according to a second embodiment includes the potential stabilizing circuit that maintains stability of the potential at the first node n1, that is, the potential between the switching circuit 21 and the amplifying circuit 25. Thus, the receiving circuit according to the second embodiment may suppress a change in the potential in the amplifying circuit 25 and may suppress slowing of the rising edge of the amplifier 26 which occurs when the amplifier 26 is switched on. The receiving circuit and the like according to the second embodiment will be described in detail below.

Second Embodiment

Referring to FIGS. 12 to 15C, a radio-frequency front-end circuit 1B according to the second embodiment will be described. The same components in the second comparison example are used in the second embodiment. The components including the same components will be described as those in the second embodiment.

Figure 12:
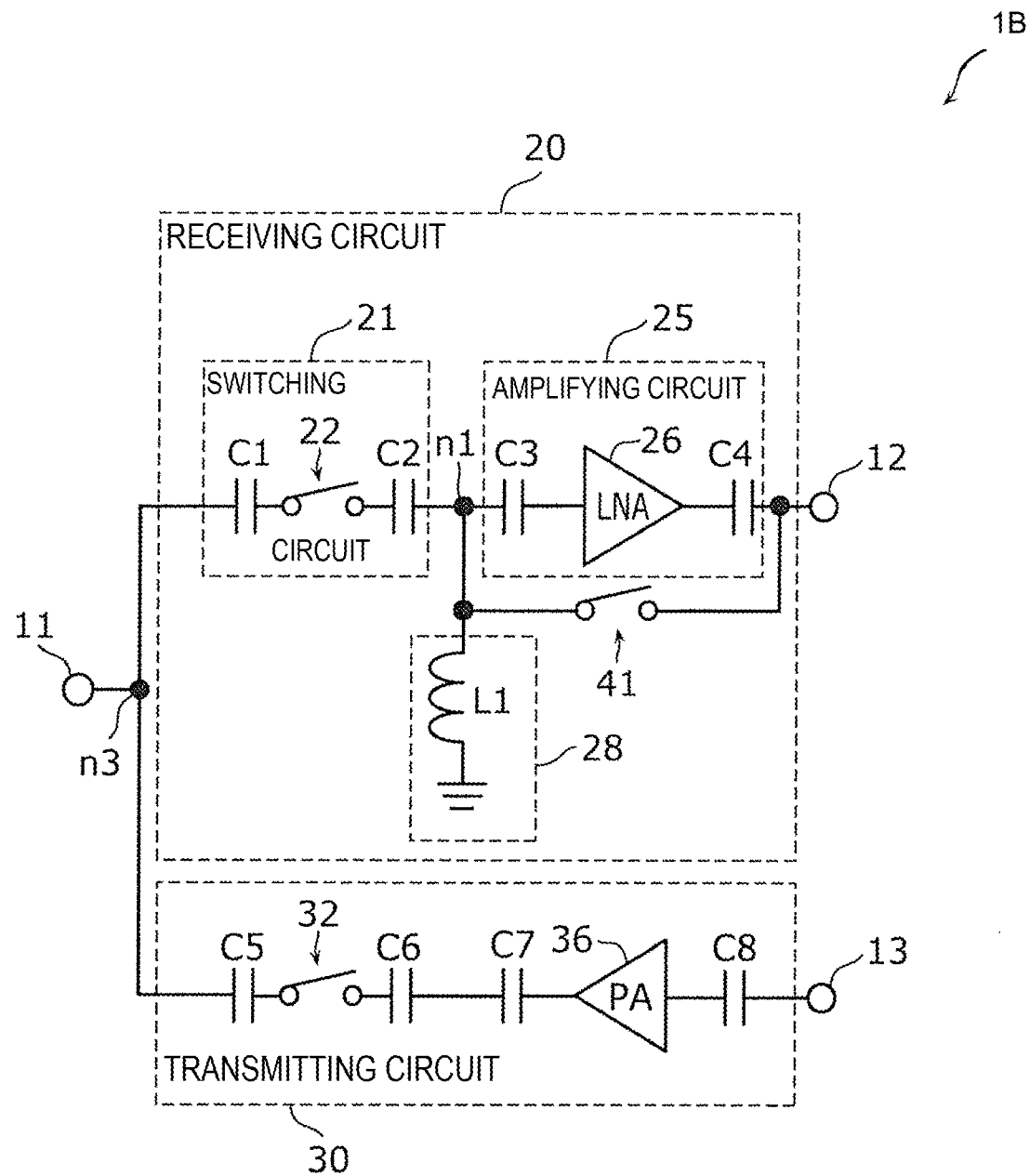
FIG. 12 is a diagram illustrating the functional block configuration of a radio-frequency front-end circuit according to a second embodiment.
Figure 13A:
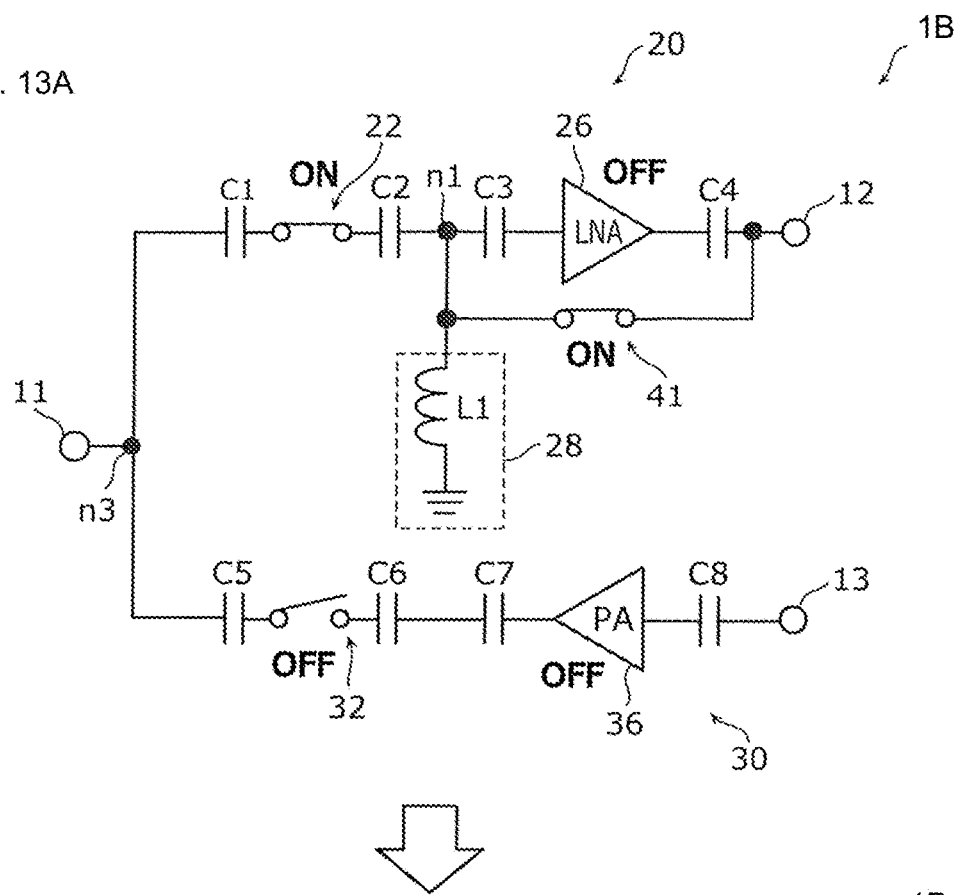
FIGS. 13A and 13B are diagrams illustrating operations of a radio-frequency front-end circuit according to the second embodiment.
Figure 13B:
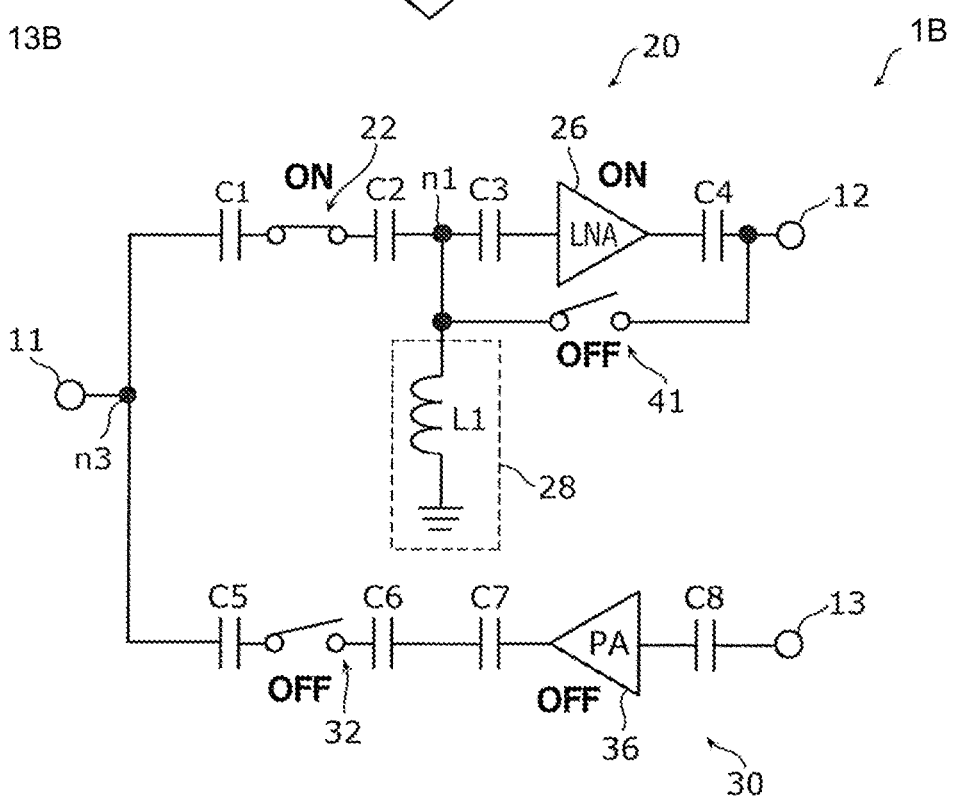
Figure 14:
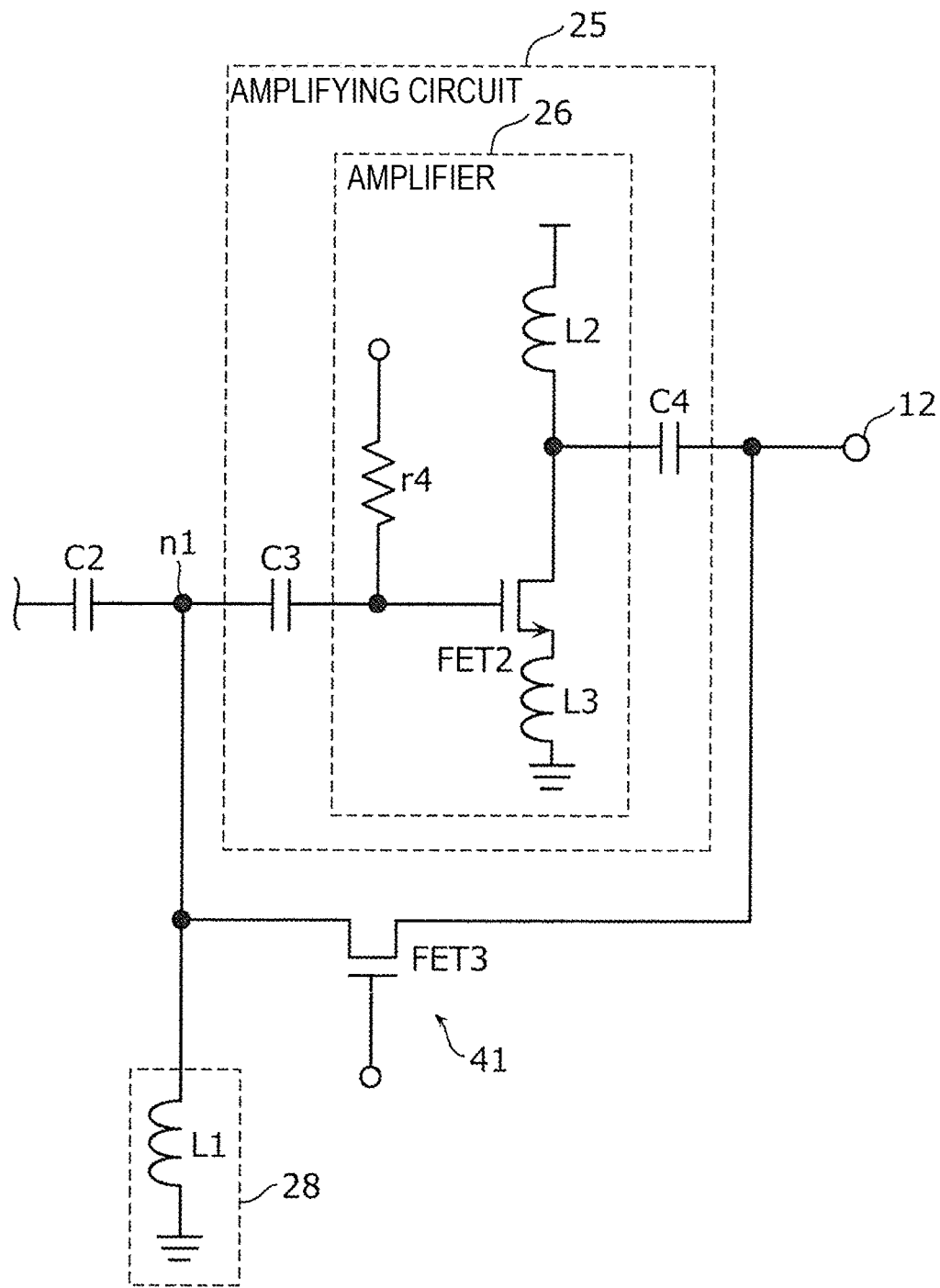
FIG. 14 is a diagram illustrating an exemplary part of a receiving circuit according to the second embodiment.
Figure 15A:
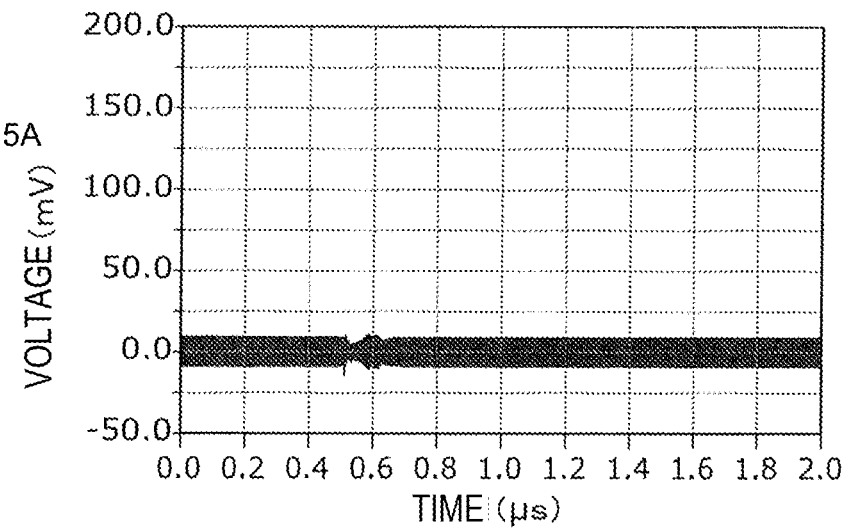
FIGS. 15A to 15C are diagrams illustrating data of a receiving circuit according to the second embodiment.
Figure 15B:
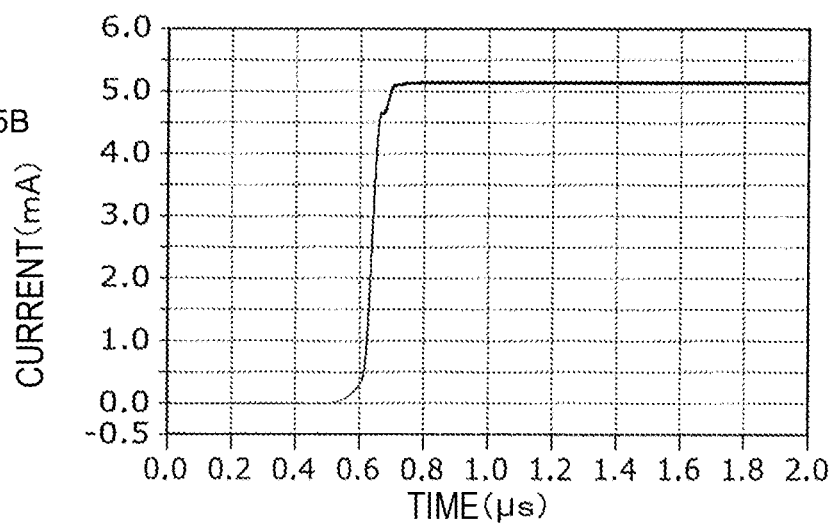
Figure 15C:
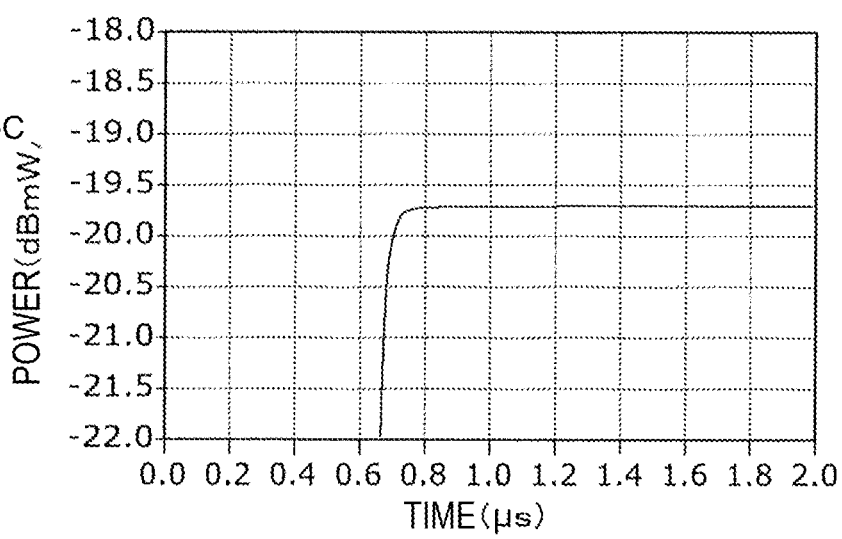

FIG. 12 is a diagram illustrating the functional block configuration of the radio-frequency front-end circuit 1B. FIGS. 13A and 13B are diagrams illustrating operations of the radio-frequency front-end circuit 1B. FIG. 14 is a diagram illustrating an exemplary part of the receiving circuit 20. FIGS. 15A to 15C are diagrams illustrating data of the receiving circuit 20.

As illustrated in FIG. 12, the radio-frequency front-end circuit 1B includes the receiving circuit 20, the transmitting circuit 30, the first terminal 11, the second terminal 12, and the third terminal 13. The receiving circuit 20 includes the switching circuit 21 and the amplifying circuit 25, and also includes the bypass switch 41. When a large receive signal is received by the receiving circuit 20, the bypass switch 41 directs the receive signal to the second terminal 12, bypassing the amplifier 26, that is, not through the amplifier 26.

The bypass switch 41 is connected in parallel with the amplifying circuit 25. The bypass switch 41 is connected to the first node n1 at one end and is connected between the amplifier 26 and the second terminal 12 at the other end. The state of being connected to the first node n1 includes the case in which the bypass switch 41 is connected between the switching circuit 21 and the first node n1 at one end, the case in which the bypass switch 41 is connected between the first node n1 and the potential stabilizing circuit 28 at one end, and the case in which the bypass switch 41 is connected between the first node n1 and the amplifying circuit 25 at one end. The bypass switch 41 may be connected between the fourth capacitor C4 of the amplifying circuit 25 and the second terminal 12 at the other end or may be connected between the amplifier 26 and the fourth capacitor C4 at the other end.

The radio-frequency front-end circuit 1B exerts control so that, when the transmitting circuit 30 is on, the receiving circuit 20 is off; and, when receiving circuit 20 is on, the transmitting circuit 30 is off. In the example described below, as illustrated in FIGS. 13A and 13B, the case in which the bypass switch 41 and the amplifier 26 are switched between on and off under the condition that the transmitting circuit 30 is off and that the switch 22 is on will be described.

As illustrated in FIG. 14, the bypass switch 41 includes the n-type transistor FET3 that is an exemplary switching device. When no gate voltage is applied to the transistor FET3, the bypass switch 41 is switched off. When a gate voltage is applied to the transistor FET3, the bypass switch 41 is switched on.

Referring to FIGS. 15A to 15C, data obtained when the bypass switch 41 is switched off and the amplifier 26 is switched on in the receiving circuit 20 according to the second embodiment will be described. In FIGS. 15A to 15C, at time 0.5 μs, the bypass switch 41 is switched from on to off, and the amplifier 26 is switched from off to on, whereby the bypass is avoided.

FIG. 15A is a diagram illustrating a change in the voltage (potential) at the first node n1. As illustrated in FIG. 15A, even when the bypass is avoided, the voltage at the first node n1 remains at 0 V. In the receiving circuit 20 according to the second embodiment, a voltage increase as in the second comparison example hardly occurs. The reason why a voltage increase hardly occurs may be that the potential stabilizing circuit 28 connected to the first node n1 enables the charge discharged from the bypass switch 41 to escape to the outside.

FIG. 15B is a diagram illustrating a change in the drain current of the transistor FET2. As illustrated in FIG. 15B, avoiding the bypass causes the drain current to rise from 0 mA smoothly, and the drain current reaches the required drain current value (about 5.2 mA) at time 1.0 μs. In the receiving circuit 20 according to the second embodiment, the drain current rises faster than that of the second comparison example.

FIG. 15C is a diagram illustrating a change in the output voltage of the amplifier 26. As illustrated in FIG. 15C, avoiding the bypass causes the output voltage of the amplifier 26 to rise stably. The receiving circuit 20 according to the second embodiment enables slowing of the rising edge of the amplifier 26 as in the second comparison example to be reduced or eliminated.

In the receiving circuit (radio frequency circuit) 20 according to the second embodiment, the potential stabilizing circuit 28 is connected to the first node n1 between the switching circuit 21 and the amplifying circuit 25, achieving suppression of a change in potential which possibly occurs between the switching circuit 21 and the amplifying circuit 25. Thus, a change in the potential in the amplifying circuit 25 may be suppressed. Slowing of the rising edge of the amplifier 26 which occurs when the amplifier 26 is switched on may be suppressed compared with the receiving circuit 520 according to the second comparison example.

Modified Example of the Second Embodiment

In a radio-frequency front-end circuit 1C according to a modified example of the second embodiment, the potential stabilizing circuit 28 includes a pull-down resistor.

Figure 16:
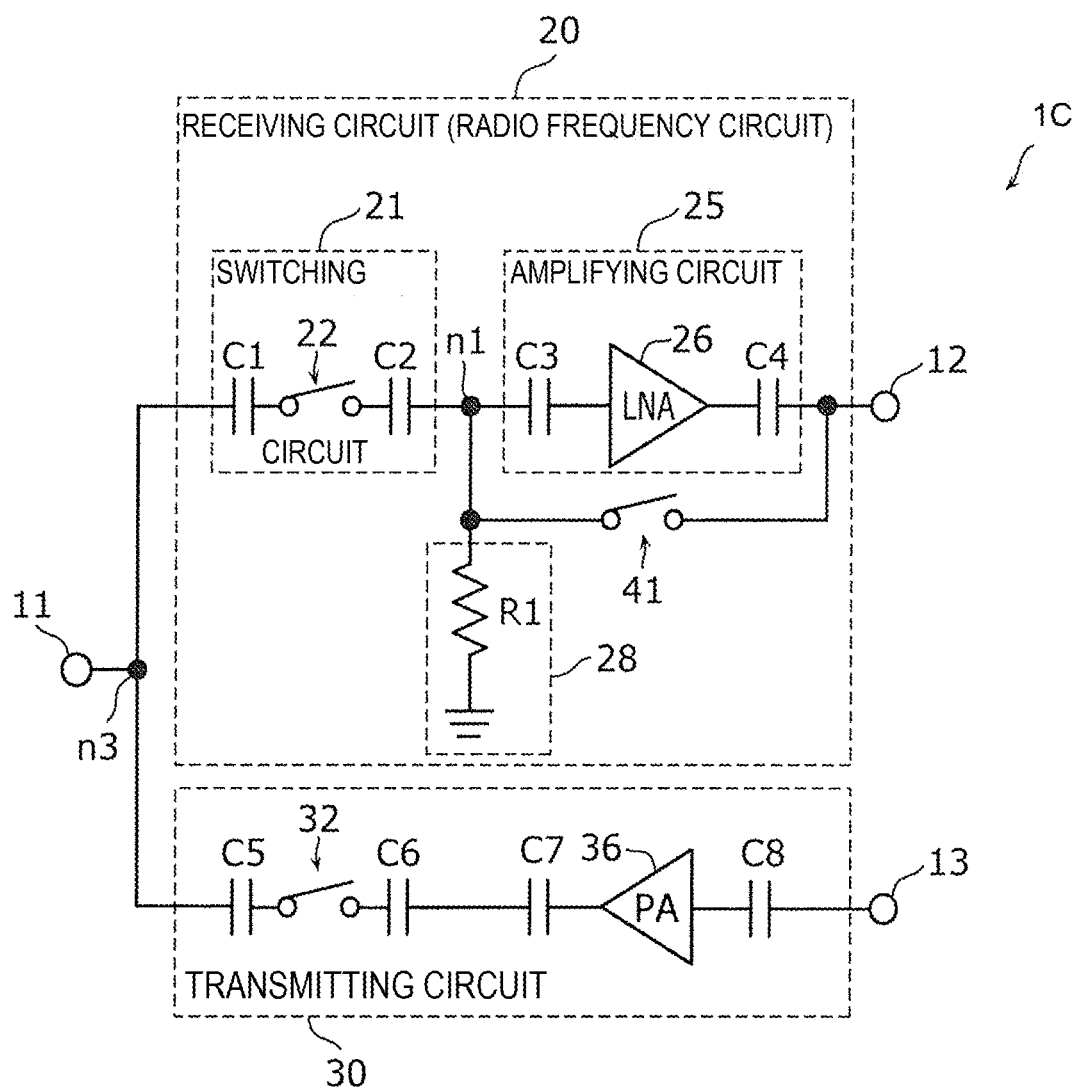
FIG. 16 is a diagram illustrating a radio-frequency front-end circuit according to a modified example of the second embodiment.

FIG. 16 is a diagram illustrating the radio-frequency front-end circuit 1C according to the modified example of the second embodiment. The receiving circuit 20 of the radio-frequency front-end circuit 1B includes the switching circuit 21, the amplifying circuit 25 connected to the switching circuit 21, and the potential stabilizing circuit 28 connected to the path between the switching circuit 21 and the amplifying circuit 25.

The potential stabilizing circuit 28 according to the modified example includes, for example, the resistor R1. Similarly, to the bypass switch 41, the resistor R1 is connected to the first node n1 at one end and is connected to the ground at the other end. When the resistor R1 is integrated into an IC, the area of the potential stabilizing circuit 28 may be made smaller compared with the case in which the inductor L1 is integrated into an IC, achieving reduction in the size of the radio frequency circuit 20.

Also in the modified example, a change in potential which possibly occurs between the switching circuit 21 and the amplifying circuit 25 may be suppressed. This enables suppression of slowing of the rising edge of the amplifier 26 which occurs when the amplifier 26 is switched on.

Third Embodiment

Figure 17:
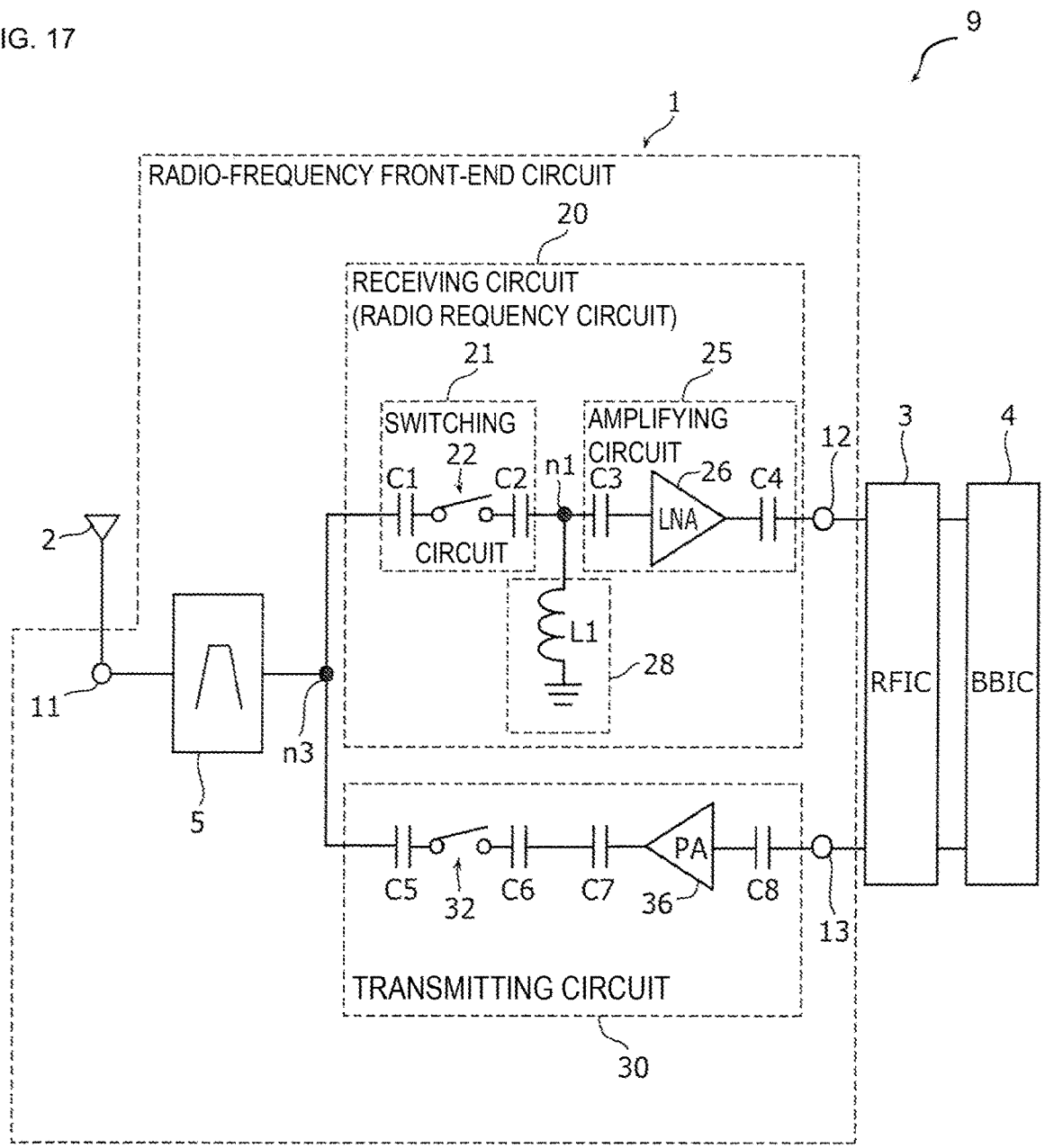
FIG. 17 is a diagram illustrating the functional block configuration of a communication device according to a third embodiment.

Referring to FIG. 17, a communication device 9 according to a third embodiment will be described. FIG. 17 is a diagram illustrating the functional block configuration of the communication device 9.

The communication device 9 includes the radio-frequency front-end circuit 1, a radio frequency signal processing circuit (RFIC) 3, and a baseband signal processing circuit (BBIC) 4.

The RF signal processing circuit 3 is, for example, a radio frequency integrated circuit (RFIC). The RF signal processing circuit 3 performs signal processing, such as upconverting, on a transmit signal received from the baseband signal processing circuit 4, and outputs, to the PA 36, the radio-frequency transmit signal generated through the signal processing. The RF signal processing circuit 3 also performs signal processing, such as downconverting, on a radio-frequency receive signal received from an antenna device 2 through a receive-signal path, and outputs, to the baseband signal processing circuit 4, the receive signal generated through the signal processing.

The baseband signal processing circuit 4 performs signal processing using the intermediate frequency band of lower frequency than a radio-frequency signal in the radio-frequency front-end circuit 1.

The radio-frequency front-end circuit 1 includes the receiving circuit (radio frequency circuit) 20 described in the first embodiment. Specifically, the radio-frequency front-end circuit 1 includes the first terminal 11 connected to the antenna device, the second terminal 12 through which a radio-frequency signal which is output from the receiving circuit 20 is output, and the third terminal 13 to which a radio-frequency signal is input. The radio-frequency front-end circuit 1 includes the third node n3 disposed between the first terminal 11 and the switching circuit 21, a filter 5 disposed between the first terminal 11 and the third node n3, and the transmitting circuit 30 disposed on the path connecting the third node n3 to the third terminal 13.

The filter 5 filters and passes a signal of the transmit frequency band among radio-frequency signals which are output from the PA 36. A transmit signal that is output from the filter 5 is output through the first terminal 11 to the antenna device 2. The filter 5 also filters and passes a signal of the receive frequency band among radio-frequency signals received through the antenna device 2 and the first terminal 11. A receive signal that is output from the filter 5 is output through the switching circuit 21 to the amplifying circuit 25. The filter 5 is, for example, a surface acoustic wave (SAW) filter.

The filter 5 may be, for example, a bulk acoustic wave (BAW) filter. In the case of a SAW filter, the filter 5 may include a substrate and interdigital transducer (IDT) electrodes.

The substrate has piezoelectricity at least on the surface. For example, the substrate may include a piezoelectric thin film on the surface, and the substrate may be formed of a multilayer body having a film having an acoustic velocity different from that of the piezoelectric thin film, a supporting substrate, and the like. The entire substrate may have piezoelectricity. In this case, the substrate is a piezoelectric substrate having a single piezoelectric material layer.

The communication device 9 according to the third embodiment includes the radio-frequency front-end circuit 1 having the receiving circuit 20 illustrated in the first embodiment. Use of the receiving circuit 20 in which the LNA that is the amplifier 26 has a sharp rising edge achieves a faster communication response of the communication device 9.

Other Embodiments

As described above, the receiving circuit (radio frequency circuit) 20, the radio-frequency front-end circuits 1 to 1C, and the communication device 9 according to the embodiments of the present disclosure are described. The present disclosure is not limited to the embodiments described above. For example, an embodiment obtained by modifying the above-described embodiments, as described below, may be encompassed in the present disclosure.

Figure 18:
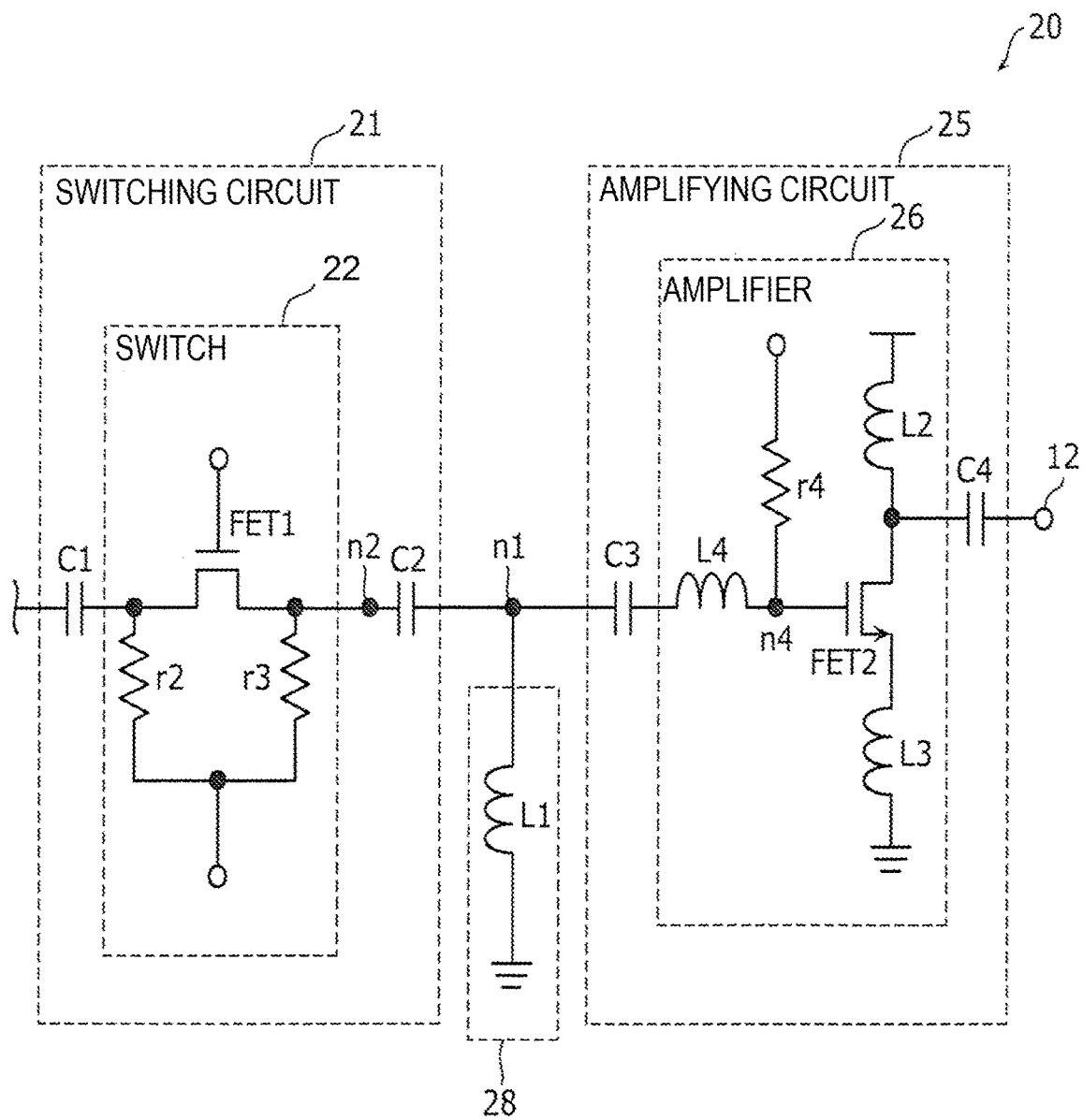
FIG. 18 is a diagram illustrating an exemplary receiving circuit according to another embodiment.

For example, as illustrated in FIG. 18, the receiving circuit 20 may include a matching inductor L4 connected in series between the first node n1 and a bias-voltage applying node n4 of the amplifier 26. As illustrated in the example in FIG. 18, in the amplifier 26, the matching inductor L4 is connected in series between the bias-voltage applying node n4, to which the resistor r4 is connected, and the third capacitor C3. This configuration enables matching with the amplifier 26. The matching inductor L4 may be disposed between the first node n1 and the third capacitor C3 in the amplifying circuit 25 (that is, in the integrated circuit). Alternatively, the matching inductor L4 may be disposed between the first node n1 and the third capacitor C3 outside the amplifying circuit 25 (that is, in a state in which the matching inductor L4 is attached outside the integrated circuit).

For example, the radio-frequency front-end circuits 1 to 1C may include the transmitting circuit 30 and the receiving circuit 20 that receive/transmit a signal in a standard other than the IEEE802.11 standard (for example, the Long Term Evolution (LTE) standard or the Wideband-Code Division Multiple Access (W-CDMA) standard). The radio-frequency front-end circuits 1 to 1C may have a configuration in which, for example, multiple transmit filters and receive filters are disposed in the circuit, and in which signals in multiple different frequency bands are received/transmitted by switching a band switch between on and off. The filter 5 is not limited to a SAW filter and may be a bulk acoustic wave (BAW) filter.

The present disclosure may be applied widely to communication equipment as a receiving circuit and a radio-frequency front-end circuit which suppress slowing of the rising edge of an amplifier which occurs when the amplifier is switched on.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio frequency circuit comprising:
   a switching circuit comprising a switch, a first capacitor, and a second capacitor connected in series between a first terminal and a first node, the switch being disposed between the first capacitor and the second capacitor;
   an amplifying circuit comprising an amplifier, a third capacitor, and a fourth capacitor connected in series between the first node and a second terminal, the amplifier being disposed between the third capacitor and the fourth capacitor; and
   a potential stabilizing circuit that is connected to the first node and that branches off from a path connecting the first terminal to the second terminal,
   wherein the first terminal is a terminal to which a first radio-frequency signal is input, and the second terminal is a terminal from which the first radio-frequency signal is output.

2. The radio frequency circuit according to claim 1,
wherein the first capacitor, the second capacitor, the third capacitor, and the fourth capacitor are DC-cutting capacitors.

3. The radio frequency circuit according to claim 1,
wherein the potential stabilizing circuit comprises an inductor having a first end connected to the first node and a second end connected to ground.

4. The radio frequency circuit according to claim 1,
wherein the potential stabilizing circuit comprises a resistor having a first end connected to the first node and a second end connected to ground.

5. The radio frequency circuit according to claim 1,
wherein a potential at a second node changes in accordance with a change in state of the switch, the second node being between the switch and the second capacitor.

6. The radio frequency circuit according to claim 5,
wherein a potential at the first node changes less in accordance with the change in state of the switch than the potential at the second node.

7. The radio frequency circuit according to claim 1, further comprising:
a bypass switch that is connected in parallel with the amplifying circuit,
wherein the bypass switch has a first end connected to the first node and a second end connected between the amplifier and the second terminal.

8. The radio frequency circuit according to claim 7,
wherein the bypass switch comprises a field-effect transistor.

9. The radio frequency circuit according to claim 1, further comprising:
a matching inductor that is connected in series between the first node and a bias-voltage applying node of the amplifier.

10. The radio frequency circuit according to claim 7, further comprising:
a matching inductor that is connected in series between the first node and a bias-voltage applying node of the amplifier.

11. The radio frequency circuit according to claim 7,
wherein the potential stabilizing circuit comprises an inductor having a first end connected to the first node and a second end connected to ground.

12. The radio frequency circuit according to claim 7,
wherein the potential stabilizing circuit comprises a resistor having a first end connected to the first node and a second end connected to ground.

13. A radio-frequency front-end circuit comprising:
a receiving circuit comprising the radio frequency circuit according to claim 1;
a third terminal at which a second radio-frequency signal is received, the second radio-frequency signal being different from the first radio-frequency signal;
a third node between the first terminal and the switching circuit;
a filter disposed between the first terminal and the third node; and
a transmitting circuit disposed between the third node and the third terminal, wherein:
the amplifier is a low noise amplifier,
the first terminal is connected to an antenna, and
the second terminal outputs the radio-frequency signal from the receiving circuit.

14. A communication device comprising:
the radio-frequency front-end circuit according to claim 13; and
a signal processing circuit configured to processes the first radio-frequency signal and the second radio-frequency signal.

* * * * *